US012418362B1

United States Patent
Du Preez et al.

(10) Patent No.: US 12,418,362 B1
(45) Date of Patent: Sep. 16, 2025

(54) FORWARD ERROR CORRECTION IN DIGITAL COMMUNICATION SYSTEMS

(71) Applicant: STELLENBOSCH UNIVERSITY, Stellenbosch (ZA)

(72) Inventors: Johan Adam Du Preez, Cape Town (ZA); Frederick Jacobus Du Toit, Cape Town (ZA)

(73) Assignee: Stellenbosch University, Stellenbosch (ZA)

( * ) Notice: Subject to any disclaimer, the term of this patent is extended or adjusted under 35 U.S.C. 154(b) by 0 days.

(21) Appl. No.: 19/040,282

(22) Filed: Jan. 29, 2025

(30) Foreign Application Priority Data

Apr. 19, 2024 (GB) .................................... 2405561

(51) Int. Cl.
*H03M 13/00* (2006.01)
*H04L 1/00* (2006.01)

(52) U.S. Cl.
CPC .................. *H04L 1/0061* (2013.01)

(58) Field of Classification Search
CPC ... H04L 1/0061; H04L 1/0057; H04L 1/0072; H04L 1/0063
See application file for complete search history.

(56) References Cited

U.S. PATENT DOCUMENTS

| | | | | |
|---|---|---|---|---|
| 7,669,106 B1 * | 2/2010 | Farjadrad | .......... | H03M 13/6597 714/768 |
| 7,818,649 B1 * | 10/2010 | Farjadrad | .......... | H03M 13/1111 714/781 |
| 8,196,010 B1 * | 6/2012 | Gunnam | .......... | H03M 13/1188 714/758 |
| 8,677,227 B2 * | 3/2014 | Gross | .......... | H03M 13/1137 714/807 |
| 8,892,979 B2 * | 11/2014 | Richardson | .......... | H03M 13/6306 714/758 |
| 8,898,537 B2 * | 11/2014 | Gross | .......... | H03M 13/1165 714/758 |
| 10,103,868 B2 * | 10/2018 | Lei | .......... | H04L 1/0063 |
| 12,289,163 B2 * | 4/2025 | Bar-Or Tillinger | ... | H04L 1/0057 |

OTHER PUBLICATIONS

Combined Search Report and Written Opinion Issued in Patent Application No. GB2405561.8, dated Nov. 25, 2024, in 11 pages.
Du Toit et al., "Low-density parity-check codes: comparing cluster graph to factor graph representations", Electrical and Electronic Engineering, Stellenbosch University, Apr. 13, 2022, 8 pages.

(Continued)

*Primary Examiner* — Esaw T Abraham
(74) *Attorney, Agent, or Firm* — Knobbe, Martens, Olson & Bear, LLP

(57) ABSTRACT

A system and apparatus implementing linear error correction using linear error correcting codes and associated linear error correcting codes are provided. The apparatus includes a receiver for receiving a sequence of symbols via a channel, the sequence of symbols having been encoded at a source using a linear error correcting code. The apparatus includes a decoder for decoding the received sequence of symbols and outputting a decoded sequence of symbols. The decoder is configured based on a multivariate message-based graph representation of the linear error correcting code.

18 Claims, 14 Drawing Sheets

(56) References Cited

OTHER PUBLICATIONS

Du Toit et al., "Low-density parity-check codes: comparing cluster graph to factor graph representations", Electrical and Electronic Engineering, Stellenbosch University, Oct. 2, 2023, 4 pages.
Mackay, "Good Error-Correcting Codes Based on Very Sparse Matrices", IEEE Transactions On Information Theory, vol. 45, No. 2, Mar. 1999, 33 pages.
Mackay, "Near Shannon Limit Performance of Low Density Parity Check Codes", Depts. of Statistics and Computer Science, University of Toronto, Jul. 12, 1996, 4 pages.
Moura et al., "Structured Low-Density Parity-Check Codes", IEEE Signal Processing Magazine, Jan. 2004, pp. 42-55.
Ohtsuki, "LDPC Codes in Communications and Broadcasting", IEICE Transactions on Communications, vol. E90-B, No. 3, Mar. 2007, pp. 440-453.
Johnson, "Introducing Low-Density Parity-Check Codes", ACoRN Spring School, Version 1.1, 83 pages.
Streicher et al., "Graph Coloring: Comparing Cluster Graphs to Factor Graphs", Electrical and Electronic Engineering, Stellenbosch University, Oct. 5, 2021, 8 pages.
Zhang et al., "Controlling the Error Floor in LDPC Decoding", IEEE Transactions on Communications, Oct. 9, 2012, 11 pages.
International Search Report and Written Opinion issued in International Application No. PCT/ZA2025/050018, mailed on Jun. 12, 2025.

\* cited by examiner

FORWARD ERROR CORRECTION IN DIGITAL COMMUNICATION SYSTEMS

CROSS-REFERENCE(S) TO RELATED APPLICATIONS

This application claims priority from United Kingdom patent application number 2405561.8 filed on 19 Apr. 2024, which is incorporated by reference herein in its entirety.

FIELD

This disclosure relates to forward error correction (FEC) in digital communication systems. More particularly, this disclosure relates to a system and apparatus implementing FEC using linear block codes.

BACKGROUND

Low-density parity-check (LDPC) codes are a family of linear block codes used as an error correction measure in digital communication systems. LDPC codes use an encoding procedure that adds parity check symbols to message symbols that help detect and fix symbol errors at the receiver. LDPC codes have been described as "good" codes due to their construction involving a sparse matrix—which implies low computational requirements—and their decoding being implemented using a simple and practical algorithm called the sum-product (SP) algorithm.

Central to the design of LDPC codes is a parity check matrix. The parity check matrix is typically a sparse binary matrix with elements that are either 0 or 1. Each row of the parity check matrix corresponds to a parity check equation that determines the value of a parity check bit, or check bit. The elements in a row indicate which bits participate in that particular parity check equation. If the element is 1, it indicates the participation of the corresponding bit at that position, and no participation otherwise. Some parity check equations in the parity check matrix may include more than one check bit. This inclusion of additional check bits in certain parity check equations enhances the overall protection capability of the LDPC code. For a given parity check matrix, there are N bits in total of which a total of K bits are message bits. The number of parity check bits is thus N−K. The dimensions of the parity check matrix are (N−K) rows by N columns.

The term "parity check factor" indicates the bit dependencies of each row of the parity check matrix by indicating the positions of the bits that participate in the parity check equation. "Factor overlap" in turn refers to the number of variables (or bits) common to two parity check factors.

LDPC codes are generally represented by a bipartite graph called a Tanner graph on which design considerations can be made directly. Despite their "simple" design, LDPC codes have been shown to achieve performance approaching the Shannon limit. Such codes are now in widespread use in, for example, various wireless communication standards, such as IEEE 802.11a, 5G NR, DVB-S2 satellite communication, DVB-T2 digital TV broadcasting standards and the like.

In an effort to improve the performance of LDPC codes, David Mackay in "Good Error-Correcting Codes Based on Very Sparse Matrices" observes that it is a disappointment that, whereas the way to obtain very good codes is to increase the density, the SP algorithm performs worse for denser matrices. The prevailing general consensus is therefore to avoid LDPC codes (or parity check matrices) having factor overlaps larger than one because doing so is felt to degrade performance. Further, a substantial factor overlap leads to increased edge cycles in the Tanner graph, consequently impacting the LDPC code performance negatively. Thus, for example, the literature consistently refers to the need to avoid 4-edge cycles in Tanner graph representations of the LDPC code.

There is accordingly scope for improvement.

The preceding discussion of the background is intended only to facilitate an understanding of the present technology. It should be appreciated that the discussion is not an acknowledgment or admission that any of the material referred to was part of the common general knowledge in the art as at the priority date of the application.

SUMMARY

In accordance with an aspect of the present disclosure there is provided an apparatus comprising a receiver for receiving a sequence of bits via a channel, the sequence of bits having been encoded at a source using a linear error correcting code; and, a decoder for decoding the received sequence of bits and outputting a decoded sequence of bits, wherein the decoder is configured based on a multivariate message-based graph representation of the linear error correcting code.

The linear error correcting code may be configured such that a metric based on an overlap of one or more parity check factors with one or more other parity check factors is greater than 1. The metric may be the average factor overlap. The average factor overlap may be determined by taking the average of the largest factor overlap of each parity check factor with one or more other parity check factors. The linear error correcting code may be configured such that the average factor overlap, determined by taking the average of the largest factor overlap of each parity check factor with all of the other parity check factors, is greater than 1.

The multivariate message-based graph may be a cluster graph or a region graph. The linear error correcting code may be configured such that a cluster graph representation thereof has at least a predetermined number of sepsets with size greater than 1. The linear error correcting code may be configured such that the cluster graph representation thereof has an average sepset size which is maximised for a predetermined minimum Hamming distance. The linear error correcting code may be configured such that the cluster graph representation thereof has an average sepset size which is greater than 1. The sepset size may be the number of variables about which two adjacent factors of the cluster graph representation of the linear error correcting code exchange information. The linear error correcting code may be configured by increasing the factor overlap of the linear error correcting code. The linear error correcting code may be a linear block code. The linear error correcting code may be a low-density parity check (LDPC) code or a polar code.

The cluster graph representation of the linear error correcting code may enable passing of joint distribution-based messages between clusters of the cluster graph representation of the linear error correcting code. The cluster graph representation of the linear error correcting code may be determined using a layered trees running intersection property (LTRIP) algorithm.

The decoder may be configured to implement sum-product message passing. The decoder may be configured to implement a loopy belief update-(LBU-) based message passing algorithm.

In accordance with another aspect of the present disclosure there is provided a decoder for decoding a received sequence of bits and outputting a decoded sequence of bits, wherein the decoder is configured based on a multivariate message-based graph representation of the linear error correcting code.

In accordance with another aspect of the present disclosure there is provided a linear error correction code configured such that a metric based on an overlap of one or more parity check factors with one or more other parity check factors is greater than 1.

The metric may be the average factor overlap. The average factor overlap may be determined by taking the average of the largest factor overlap of each parity check factor with one or more other parity check factors. The linear error correcting code may be configured such that the average factor overlap determined by taking the average of the largest factor overlap of each parity check factor with all of the other parity check factors is greater than 1. The linear error correcting code may be configured such that the cluster graph representation thereof has an average sepset size which is maximised for a predetermined minimum Hamming distance. The linear error correcting code may be configured such that the cluster graph representation thereof has an average sepset size which is greater than 1. The sepset size may be the number of variables about which two adjacent factors of the cluster graph representation of the linear error correcting code exchange information. The linear error correcting code may be configured by increasing the factor overlap of the linear error correcting code. The linear error correcting code may be a linear block code. The linear error correcting code may be a low-density parity check (LDPC) code or a polar code.

In accordance with another aspect of the present disclosure there is provided a method comprising: receiving a sequence of bits via a channel, the sequence of bits having been encoded at a source using a linear error correcting code; initialising parity check clusters of a cluster graph representation of the linear error correcting code based on the received sequence of bits; initiating message passing between the parity check clusters; and, when a consensus between all the parity check clusters regarding shared bit values is reached, outputting a decoded sequence of bits.

The message passing may be based on a message passing schedule determined for the cluster graph representation of the linear error correcting code. Outputting the decoded sequence of bits may be when consensus is reached and when: a syndrome check is successfully completed; or, a maximum number of iterations is reached. Message passing may iterate until consensus is reached. Message passing may be implemented using a loopy belief update-(LBU-) algorithm.

Embodiments of the technology will now be described, by way of example only, with reference to the accompanying drawings.

DETAILED DESCRIPTION

Figure 1A:
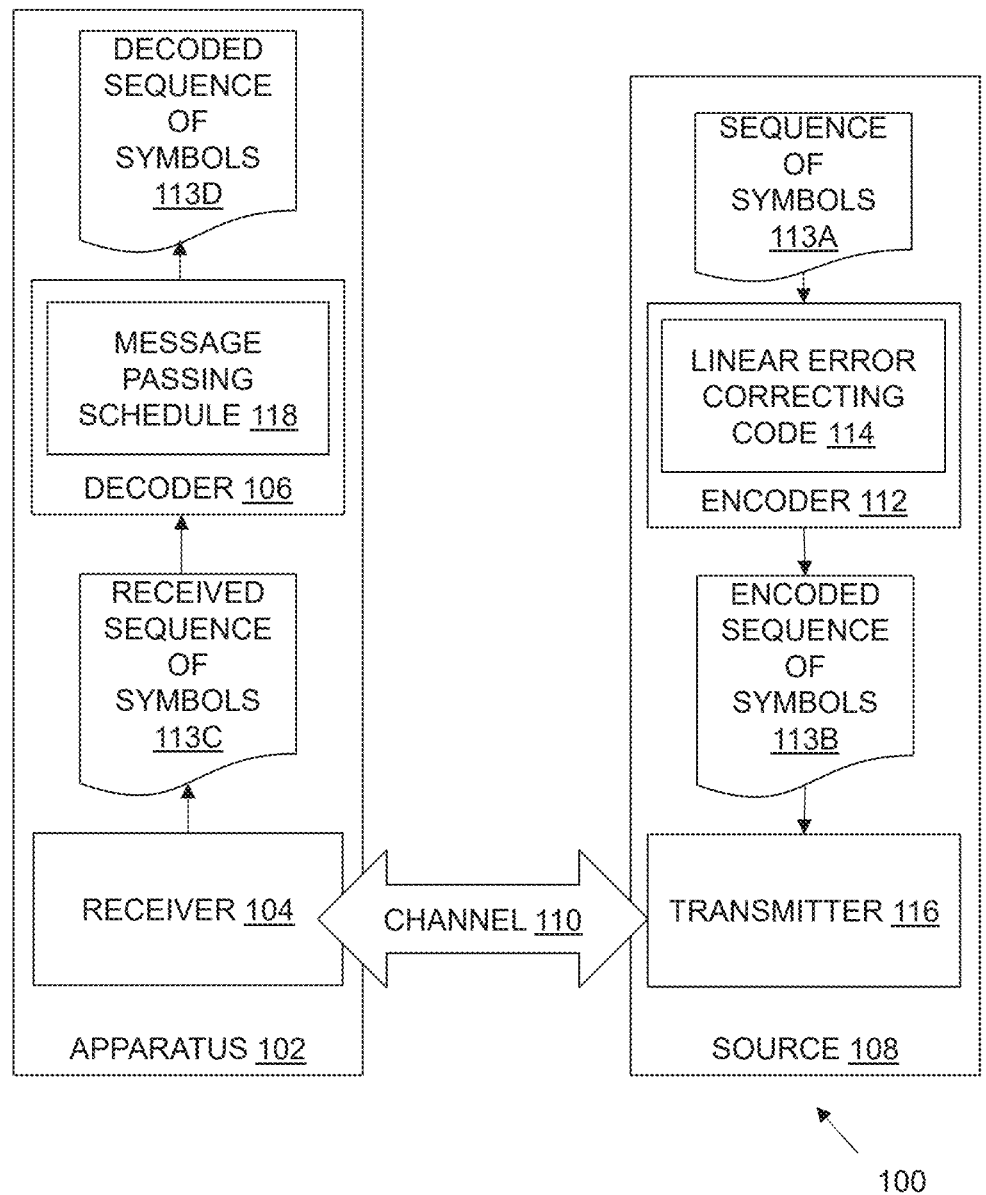
FIG. 1A is a schematic diagram which illustrates an example system in which linear error correction is implemented according to aspects of the present disclosure.

A system implementing linear error correction using linear error correcting codes is described herein. The system includes a source from which an encoded sequence of symbols (such as bits) is transmitted via a channel. The encoded sequence of symbols is encoded at the source using a linear error correcting code. The system includes an apparatus which receives a sequence of symbols from the source via the channel. As the channel may introduce noise and other challenges, the received sequence of symbols may not be the same as the encoded sequence of symbols transmitted from the source. The apparatus includes a decoder which is arranged to decode the received sequence of symbols and to output a decoded sequence of symbols. The decoder is configured based on a multivariate message-based graph representation of the linear error correcting code. The multivariate message-based graph representation of the linear error correcting code may for example be a cluster graph representation of the linear error correcting code or a region graph representation of the linear error correcting code.

In some examples, the linear error correcting code is configured such that a metric or parameter thereof meets a predefined constraint. For example, the metric may be based on an overlap of one or more parity check factors of the cluster graph representation of the linear error correcting code. The metric may for example be that the average factor overlap is greater than 1. In some examples, the average factor overlap may be maximised for a predetermined minimum Hamming distance. In some examples, the linear error correcting code is configured such that the cluster graph representation thereof has an average sepset size which is maximised for a predetermined minimum Hamming distance. The linear error correcting code may for example be configured such that the cluster graph representation thereof has an average sepset size which is greater than 1. Linear error correcting codes with large factor overlap have cluster graph representations with large sepsets. Having large sepsets can reduce the number of loops in the cluster graph and messages passed between clusters are more informed, resulting in more accurate and faster inference (or decoding).

In this manner a metric (e.g. being a design parameter) is provided for configuration to arrive at better decoding performance when applying the cluster graph methodology to linear error correcting codes in general. The metric or design parameter may be the average factor overlap, average sepset size, or the like. More specifically, maximising this metric (in some cases subject to constraints such as minimum Hamming distance) improves performance of the linear error correcting code (as discussed in greater detail below). In other words, denser parity check matrices (in turn producing larger sepsets) result in better codes. The concept of maximising average factor overlap runs contrary to current understanding regarding linear error correcting code performance. Specifically, at present in the state of the art, factor overlap is sought to be minimized because it is believed to affect performance negatively.

The term "sepset" refers to a "separation set" of the cluster graph. Considering for example a cluster graph with nodes C including a subset of variables $\{X_1, \ldots, X_n\}$, a sepset $S_{ij}$ is the subset of variables between nodes $C_i$ and $C_j$ that are in the intersection of the scopes of both nodes. "Scope" refers to a list of variables on which node C depends. In the present context, a node may be a parity check factor of the linear error correcting code. In other words, each node of the cluster graph may represent a parity check factor. Generally, sepsets are of relevance because they determine (e.g. in belief propagation) whether a node $C_i$ sends a message to $C_j$ about a given variable. Messages containing information about a variable are only sent if the variable is in the sepset, $S_{ij}$. The messages may be joint-distribution based because they can include a plurality of variables. The term "sepset size" refers to the number of variables (or bits) about which two adjacent factors of the cluster graph representation of the linear error correcting code exchange information. Sepset size may thus refer to the number of variables in the sepset, and thus the number of variables involved in a joint distribution-based message of the cluster graph representation of the linear error correcting code.

Aspects of the present disclosure are thus directed towards using a multivariate message-based graph representation of a linear error correcting code and generating, configuring or selecting the linear error correcting code to have larger average sepset size (which corresponds to larger factor overlap).

In this manner, the linear error correcting code may be generated subject to the following constraints: for a preferred minimum Hamming distance, larger average sepset size (which corresponds to larger factor overlap) is sought. In the corresponding cluster graph representation of the linear error correcting code, clusters are linked up or connected in such a way that sepset size is maximised while preserving the so-called running intersection property (RIP).

Unlike a multivariate message-based graph representation of the linear error correcting code, a factor graph (also known as a Tanner graph, also known as a Béthe graph) automatically achieves the RIP by constraining the messages to always be about a single variable. However, this destroys correlations, thereby causing inferior inference.

One example of a multivariate message-based graph representation of the linear error correcting code is a cluster graph representation. Unlike the factor graph, a cluster-graph considers the intersections of the variables in adjacent factors, thereby being able to preserve correlations between them (communicated via messages on these larger sepsets). However, when there are loops where each sepset in the loop contains a particular RV, the influence of that RV will be overcounted (and correspondingly over-emphasised in the inference). This leads to erroneous convergence. To counter this, these loops must be broken by removing particular RVs at strategic positions. This can be achieved using the LTRIP algorithm. I.e. in order to preserve RIP some sepsets will not be full intersections, but subsets of them.

Another example of a multivariate message-based graph representation of the linear error correcting code is a region graph representation. The region-graph proceeds in a slightly different manner. It considers the full intersections of the factors, and then the full intersections of those intersections, proceeding in this way until there are no further intersections remaining. Using this structure, "counting numbers" can be determined and in turn used to determine where overcounting takes place and how these can be rectified.

FIG. 1A is an example system (100) in which linear error correction is implemented according to aspects of the present disclosure. The system includes an apparatus (102) having a receiver (104) and a decoder (106). The system further includes a source (108) from which encoded sequences of symbols are transmitted to the apparatus (102) via a channel (110). The source may be another apparatus, device or the like. The channel (110) may be provided by an interface between the apparatus and the source by which messages may be exchanged. The channel may be a wired or wireless communication channel (which can include a channel via which information is stored in and retrieved from media).

The source includes an encoder (112) which is configured to encode a sequence of symbols (113A) to output an encoded sequence of symbols (113B). The sequence of symbols may be a sequence of bits. The encoder uses a linear error correcting code (114) to encode the sequence of symbols. The linear error correcting code may be a linear block code, such as a polar code or a low-density parity-check (LDPC) code. The linear error correcting code may be based on a parity check matrix, H. The terms "linear error correcting code" as used herein may be synonymous with "parity check matrix".

In some examples, the linear error correcting code is configured such that a cluster-graph representation-based metric thereof is greater than 1. The cluster-graph representation-based metric may be a metric based on or derived or determined from a cluster-graph representation of the linear error correcting code. The metric may be based on an overlap of one or more parity check factors with one or more other parity check factors of the cluster graph representation of the linear error correcting code. The metric may for example be the average factor overlap. The average factor overlap may be determined by taking the average of the largest factor overlap of each parity check factor with one or more other parity check factors. The average factor overlap may be determined by taking the average of the largest factor overlap of each parity check factor with all of the other parity check factors. Thus, for example, the linear error correcting code may be configured such that the average factor overlap, determined by taking the average of the largest factor overlap of each parity check factor with all of the other parity check factors, is greater than 1.

In some examples, the metric is based on sepset size. For example: a predetermined number of sepsets with size greater than 1; or, the average sepset size. For example, the linear error correcting code may be configured such that a cluster graph representation thereof has: at least a predetermined number (e.g., one or more, two or more, etc.) of sepsets with size greater than 1; a number of sepsets with size greater than 1, maximised for a predetermined minimum Hamming distance; an average sepset size which is maximised for a predetermined minimum Hamming distance; an average sepset size greater than 1, or the like. In some examples, the linear error correcting code is configured such that the cluster graph representation thereof has an average sepset size which is greater than 1.2; greater than 1.3; greater than 2; and the like. The sepset size is the number of variables involved in a joint distribution-based message of the cluster graph representation of the linear error correcting code. Two examples of such codes are as follows:

A first code, 60 bits with a minimum Hamming distance 9:47 sepsets with 1 variables; 20 sepsets with 2 variables; 17 sepsets with 3 variables; 14 sepsets with 4 variables; and 3 sepsets with 5 variables. Average sepset size for this first code is: 2.069.

A second code, 1280 bits with an upper bound minimum Hamming distance 164:2729 sepsets with 1 variables; 658 sepsets with 2 variables; 199 sepsets with 3 variables; and, 5 sepsets with 4 variables. Average sepset size for this second code is: 1.298.

In accordance with aspects of the present disclosure, therefore, the linear error correcting code may be configured by increasing the factor overlap of the linear error correcting code.

In some examples, for a given parity check matrix, there are N symbols in total of which K represents the original number of message symbols within the N number of total symbols within the codeword. K is usually smaller than N. The number of parity check symbols is therefore N−K. The dimensions of the parity matrix are (N−K) rows by N columns.

In some examples, the sequence of symbols is a message, m, being a row vector. The symbols may be bits. In some examples, the encoded sequence of symbols may be termed a codeword, C. In some examples, the encoded sequence of symbols, or codeword, may be generated from the sequence of symbols using a generator matrix G, as follows:

$$C=mG$$

The generator matrix may be created by performing Gauss-Jordan elimination (using module-2 operations) on the parity check matrix to obtain:

$$H_{std}=[A,I_{N-K}],$$

where A is a binary matrix with (N−K) number of rows and K number of columns and $I_{N-K}$ is the identity matrix. The generator matrix may be obtained as follows:

$$G=[I_K A^T]$$

A valid generator matrix must be orthogonal to the parity check matrix, for which:

$$GH^T=0$$

The codeword may therefore be a sequence of encoded symbols that comprises message symbols and parity check symbols. The generator matrix must produce 2K valid codewords, where:

$$HC^T=0$$

holds for all codewords. For every possible sequence of message symbols, a unique and valid codeword should be produced. From a decoding perspective, a validly received codeword must satisfy all parity check constraints originally imposed by the encoder. This can be verified by performing the modulo-2 addition (XOR operation) on a check symbol and all its symbol dependencies, which must equal zero. A group of such checks, called a syndrome, is used to indicate which parity check constraints are satisfied. For a decoded vector y, the syndrome of y is calculated as follows (using modulo-2 operations):

$$s=Hy^T$$

The source includes a transmitter (116) configured to transmit the encoded sequence of symbols to the apparatus (102) via the channel (110).

The receiver (104) of the apparatus is configured to receive the encoded sequence of symbols from the source via the channel. As described above, the encoded sequence of symbols has been encoded based on or using a linear error correcting code. The channel (110) may introduce noise or may otherwise change the encoded sequence of symbols such that the sequence of symbols (113C) received by the receiver contain errors or missing symbols. Thus, the received sequence of symbols may not be exactly the same as the encoded sequence of symbols transmitted to the apparatus via the channel. In some cases, the received sequence of symbols is a set of discrete symbols representing values such as 0 and 1. In other cases, the received sequence of symbols is a continuous waveform which is decoded into discrete symbols.

The decoder (106) is configured to decode the received sequence of symbols and to output a decoded sequence of symbols (113D). The decoder may be configured based on a cluster graph representation of the linear error correcting code. The cluster graph representation of the linear error correcting code may enable passing of joint distribution-based messages between clusters. In some examples, the cluster graph representation of the linear error correcting code is determined using a layered trees running intersection property (LTRIP) algorithm.

In some examples, the decoder is configured to implement sum-product message passing to decode the encoded sequence of symbols. In some examples, the decoder is configured to implement a loopy belief update-(LBU-) based message passing to decode the encoded sequence of symbols. The LBU-based message passing algorithm may be based on the loopy belief propagation (LBP) algorithm. The LBP algorithm is an iterative message passing algorithm that performs approximate inference in loopy graphical models.

For LBP message passing, a message passed from cluster a to cluster b is denoted as a,b. The product of all other messages incoming to cluster node a—excluding message $u_{b,a}$—is denoted by $u_{\dagger b,a}$. If anything changes in the messages $u_{\dagger b,a}$, these changes can be propagated towards cluster b via an update equation:

$$\mu'_{a,b} = \sum_{\backslash S_{a,b}} \mu_{\backslash b,a} \phi_a,$$

where the marginalisation sum over the set $S_{a,b}$ removes all variables not present in the sepset $S_{a,b}$.

The LBU-based message passing algorithm may be the so-called Lauritzen-Spiegelhalter message passing algorithm (S. L. Lauritzen and D. J. Spiegelhalter, "Local computations with probabilities on graphical structures and their application to expert systems," Journal of the Royal Statistical Society: Series B (Methodological), vol. 50, no. 2, pp. 157-194, 1988.), which is a variant of the LBP algorithm. The LBU algorithm may be mathematically equivalent to the LBP algorithm.

In contrast to LBP, LBU message passing is expressed fully in terms of only cluster beliefs and sepset beliefs. For this, two alternative (although equivalent) update expressions for these quantities may be used. The sepset belief update is given by:

$$\psi'_{a,b} = \sum_{\backslash S_{a,b}} \Psi'_a$$

This may be computationally more efficient as compared to LBP since it avoids the repeated re-combination of the various messages present in the $u_{\dagger b,a}$ term the equation for determining $u'_{a,b}$, defined above, when considering different target clusters b. Using this the cluster belief can be updated incrementally using:

$$\Psi'_b = \Psi_b \frac{\psi'_{a,b}}{\psi_{a,b}}$$

A more general implementation of the LBU algorithm is given as follows:

In an initialisation stage:
A. Initialise messages: $\mu_{a \to b}$ from all source clusters a to their destination clusters b typically using uniform distributions.
B. Initialise cluster beliefs: each cluster forms an initial cluster belief $\psi_a$ as the product of its internal factor with all its incoming messages.
C. Initialise sepsets: all sepsets $S_{a,b}$ forms an initial belief $\psi_{a,b}$ as the product of the two messages from opposite directions.

while convergence criterion is not met do

1. Send a message from cluster a to cluster b by updating the sepset belief:

$$\psi'_{a,b} = \sum_{\backslash S_{a,b}} \Psi_a$$

2. Use the updated sepset belief and update the target cluster belief:

$$\Psi'_b = \Psi_b \frac{\psi'_{a,b}}{\psi_{a,b}}$$

3. Check for convergence.
4. Set the previous sepset belief to be equal to the newly formed sepset:

$$\psi_{a,b} = \psi'_{a,b}$$

end while.

Convergence may be determined by monitoring the distance between the old and new sepset beliefs using the Kullback-Leibler (KL) divergence measure. When this distance is below some threshold value the algorithm can be terminated, or after a maximum number of iterations were completed. Alternatively, convergence may be determined by first evaluating whether all clusters agree on their shared bit values and then applying an error detection technique. This approach may be more computationally efficient than implementing the KL divergence measure.

The decoder may implement a message passing schedule (118). The message passing schedule may be determined based on the cluster-graph based representation of the linear error correcting code.

The message passing schedule is important for loopy graphs as the message order can influence convergence speed, accuracy, and the computational cost of inference. The message passing schedule may therefore: use a structured schedule having a fixed computational cost, be configured to minimise the effect of loops; and, be configured to minimise the computational cost of inference.

Figure 1B:
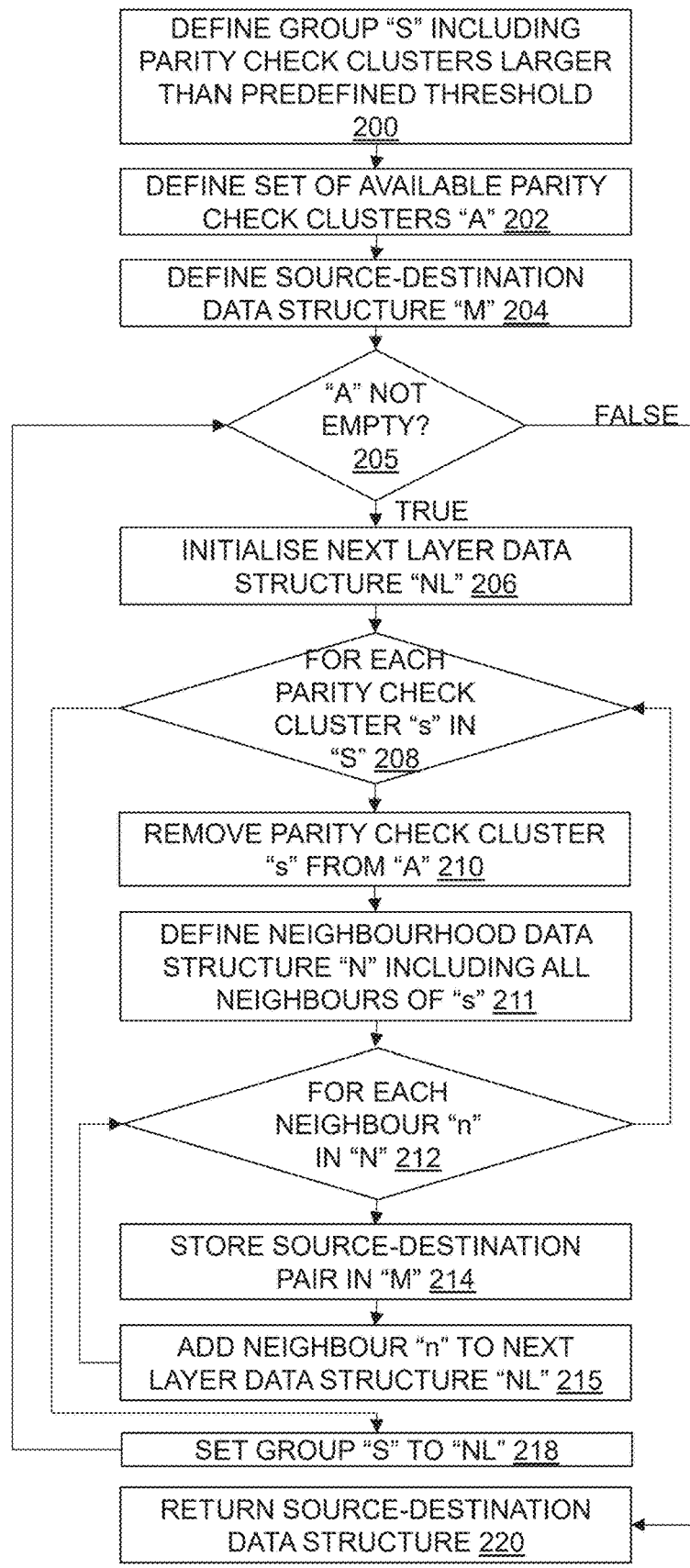
FIG. 1B is a flow diagram which illustrates an example method for determining a message passing schedule according to aspects of the present disclosure.

In some examples, the message passing schedule is a collection or arrangement of source-destination pairs. For example, and referring now to FIG. 1B, the message passing schedule may be determined by defining (200) a group of parity check clusters including one or more parity check clusters of the cluster graph representation of the linear error correcting code which are larger than a predefined threshold. Cluster size in this context refers to the number of bits in the parity check cluster. The goal is that during message passing, messages visit the largest parity check cluster (or set of larger parity check clusters) last. Any of the large clusters (one or multiple clusters) can be selected as initial clusters in determining the message passing schedule. A set of available parity check clusters is defined (202) and initialised to include all parity check clusters. A source-destination data structure (204) for source-destination pairs is defined and initialised as empty.

While (205) the set of available parity check clusters is not empty, the method includes: initialising (206) a next layer data structure; for each parity check cluster in the group of parity check clusters (208): removing (210) that parity check cluster from the set of available parity check clusters; defining (211) a neighbourhood data structure as including all neighbours of that parity check cluster; for each parity check cluster in the neighbourhood data structure which is included in the set of available parity check clusters (212): storing (214) the source-destination pair in the source-destination data structure and if the relevant neighbour is not included in the set of parity check clusters, adding (215) the neighbour to the next layer data structure. Once (208) all parity check clusters in the set of parity check clusters have been iterated through, the parity check clusters in the group of parity check clusters are replaced with the parity check clusters of the next layer data structure and the method repeats (218) until the set of available parity check clusters is empty and the source-destination data structure is returned (220) as the message passing schedule.

In other words, one of the larger parity check clusters may be selected as the cluster as the initial source S and the method may proceed by visiting all its neighbouring clusters N, which become the immediate next layer of clusters. A set of available parity check clusters A is kept to ensure that clusters from previous layers are not prematurely revisited, which helps minimise the effect of loops. This procedure is repeated to add subsequent layers of clusters until all clusters are included. The source-destination pairs are stored in a message schedule M. In this manner, expensive clusters are kept at the final layer so that the smaller (less expensive) parity clusters, in preceding layers, can resolve some of the uncertainty about the even parity states. The above-described method may be implemented as follows:

```
1:   S ← set initialised to large cluster IDs
2:   A ← set initialised to all cluster IDs
3:   M ← empty vector of pairs
4:   while A is not empty do
5:       nextLayer ← empty set of integers
6:       for s in S do
7:           A.erase(s)
8:           N ← all neighbours of s
9:           for n in N do
10:              if n ∈ A then
11:                  M.push_back(pair(s, n))
12:              if n ∉ S then
13:                  nextLayer.insert(n)
14:              end if
15:          end if
16:      end for
17:      end for
18:      S ← nextLayer
19:  end while
20:  return M
```

In this manner, observed conditional Gaussian clusters, in the case of continuous wave forms which are to be decoded, are coupled to the parity check clusters in the layer furthest away from the initial isolated group of large clusters. This layer may be referred to as the first parity check layer. The smaller parity check clusters in this layer are given priority in terms of their connectivity to the conditional Gaussian clusters, which saves computation. If the first layer of parity check clusters does not have all the unique bits, the following layers are utilised until all conditional Gaussian clusters are connected to parity check clusters.

Figure 1C:
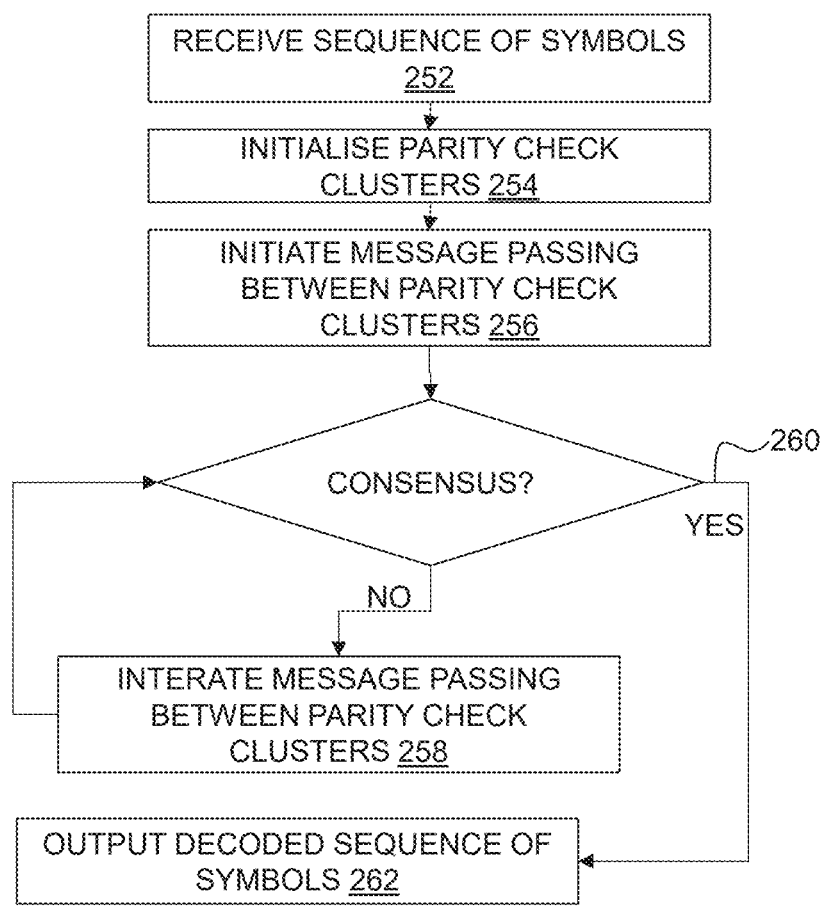
FIG. 1C is a flow diagram which illustrates a method for decoding a received sequence of symbols according to aspects of the present disclosure.

A method for decoding a received sequence of symbols is illustrated in FIG. 1C. The method may be implemented by an apparatus, such as the apparatus described above with reference to FIG. 1A. The method includes receiving (252) a sequence of symbols via the channel. As explained above, the sequence of symbols has been encoded at a source using a linear error correcting code. The method includes initialising (254) parity check clusters of a cluster graph representation of the linear error correcting code based on the received sequence of symbols.

The method includes initiating (256) message passing between the parity check clusters. Message passing may be based on a message passing schedule determined for the cluster graph representation of the linear error correcting code (e.g., as described above). Message passing may be implemented using the LBU-algorithm. Message passing iterates (258) until consensus between all the parity check clusters regarding shared bit values is reached. The method includes, when (260) consensus is reached, outputting (262) a decoded sequence of symbols. In some examples, the decoded sequence of symbols is output when consensus is reached and when: a syndrome check is successfully completed; or, a maximum number of iterations is reached.

Figure 2:
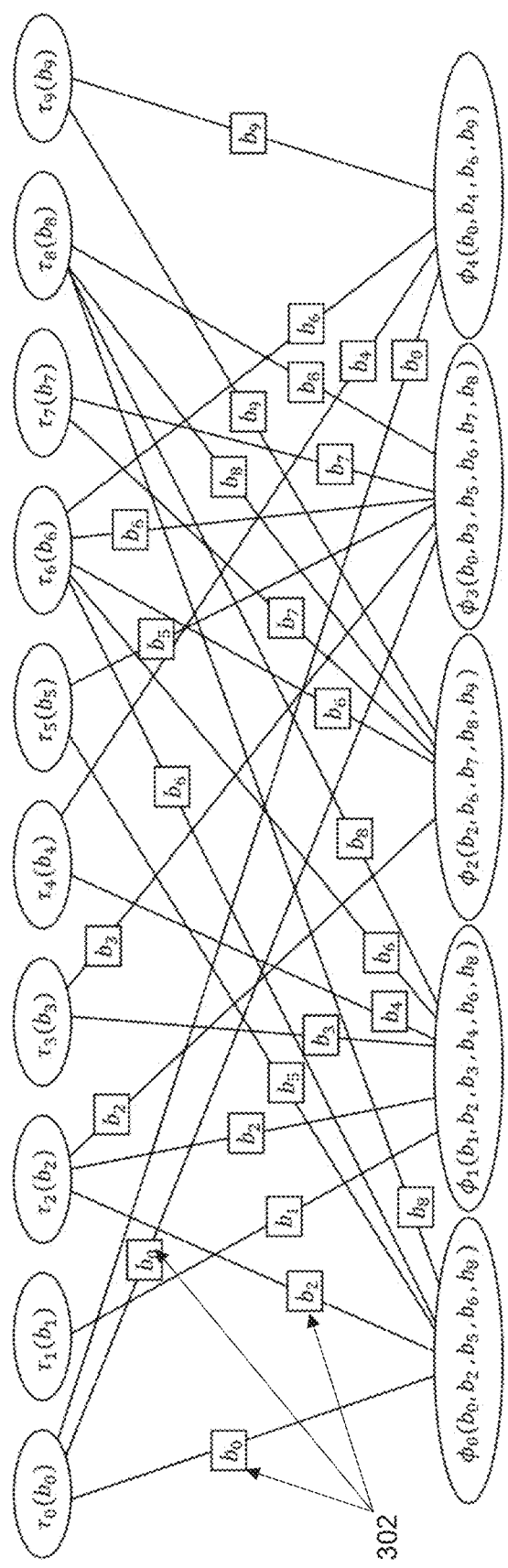
FIG. 2 is a factor graph representation of a (10,5,4) LDPC code in which cluster graph notation illustrating sepsets is used.
Figure 3:
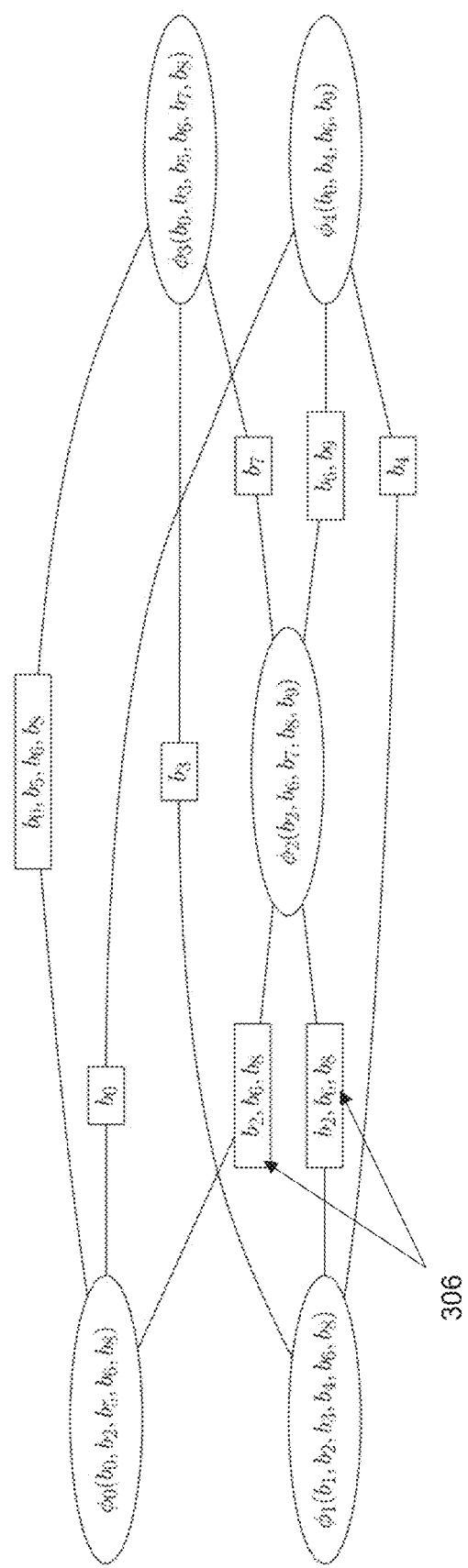
FIG. 3 is a cluster graph representation of the (10,5,4) LDPC code generated using the LTRIP construction algorithm and in which the resulting factors are the same as the original parity check constraints, but the sepsets can contain multiple random variables.

FIGS. 2 and 3 illustrate two different graphical representations of a linear error correction code on which inference can be performed. More specifically, two different graphical structures of the same (10,5,4) LDPC code are provided. Although FIGS. 2 and 3 are based on an LDPC code, it should be appreciated that other types of linear error correcting codes may be used instead. Inference can be performed on each graph structures with LBP- or LBU-based message passing. However, it is typical to use LBP on a factor graph. LBU may be implemented on the cluster graph structures.

For the purpose of illustration, a (10,5,4) LDPC code is used. The parity check matrix of this code is as follows:

$$H = \begin{bmatrix} 1 & 0 & 1 & 0 & 0 & 1 & 1 & 0 & 1 & 0 \\ 0 & 1 & 1 & 1 & 1 & 0 & 1 & 0 & 1 & 0 \\ 0 & 0 & 1 & 0 & 0 & 0 & 1 & 1 & 1 & 1 \\ 1 & 0 & 0 & 1 & 0 & 1 & 1 & 1 & 1 & 0 \\ 1 & 0 & 0 & 0 & 1 & 0 & 1 & 0 & 0 & 1 \end{bmatrix}$$

This example LDPC code is a systematic LDPC code in which the first 5 bits, b0 to b4, are the message bits and the remaining bits, b5 to b9, are the redundant check bits. The minimum Hamming distance property of this code is dmin=4, meaning the code can fix up to one bit error. When considering an LDPC code as a probabilistic graphical model, such as a factor graph or cluster graph, an even parity check constraint plays the role of a factor. A parity check bit's value is deterministic and is determined by counting the number of 1's in the sequence of bits that take part in that parity check equation. If there is an even number of 1's, the parity bit is set to 0. If there is an odd number of 1's, the parity bit is set to 1. This is the XOR of all the bits present in the parity check equation. A discrete factor can be created that encapsulates this logic. The (10,5,4) LDPC code contains 5 parity check factors of different sizes (i.e., 5, 6, 5, 6, and 4), which deems this an irregular LDPC code.

Parity check factors are denoted as $\phi_0$ to $\phi_4$. The smallest parity check factor $\phi_4$, with bit dependencies b0, b4, b6, and b9, is shown in Table 3.1 as a table factor as follows:

| $b_0$ | $b_4$ | $b_6$ | $b_9$ | $\phi_4(b_0, b_4, b_6, b_9)$ |
|---|---|---|---|---|
| 0 | 0 | 0 | 0 | 1 |
| 0 | 0 | 1 | 1 | 1 |
| 0 | 1 | 0 | 1 | 1 |
| . | . | . | . | . |
| 1 | 1 | 1 | 1 | 1 |
| | elsewhere | | | 0 |

Ones (representing absolute certainty) are assigned to the joint states (the factor potential) where all bits present an even number of ones, with zero (no possibility) given otherwise.

FIG. 2 provides an example Tanner (or factor) graph representation (300) of the (10,5,4) LDPC code. It should be noted that although FIG. 2 provides a Tanner graph representation of the code, cluster graph notation used to illustrate sepsets (302) is included in the Tanner graph representation for purpose of comparison with the cluster graph representation of the same code. It can be seen from FIG. 2 that all sepsets contain only one variable.

Each of the parity check clusters $\phi 0(b0, b2, b5, b6, b8)$, $\phi 1(b1, b2, b3, b4, b6, b8)$, $\phi 2(b2, b6, b7, b8, b9)$, $\phi 3(b0, b3, b5, b6, b7, b8)$, and $\phi 4(b0, b4, b6, b9)$ will have table factors, as shown in the above table, with their own scope of variables. The parity check clusters are the large clusters, with one small cluster for each bit. Note that the single variable clusters (known as the variable nodes in a Tanner graph) are also considered as clusters and are represented by $\tau 0(b0)$ to $\tau 9(b9)$. The Tanner graph and factor graph are structurally similar but the scope of the messages required between the clusters are shown explicitly via the sepsets. Inference on this graphical structure typically proceeds by using LBP in which the messages are initialised using the bit probabilities obtained from the transmission channel. A typical message schedule to use for LDPC codes is to send messages from all single variable clusters ($\tau 0(b0)$ to $\tau 9(b9)$) to all the parity check clusters ($\phi 0(b0, b2, b5, b6, b8)$ to $\phi 4(b0, b4, b6, b9)$), and vice versa. One iteration of message passing is achieved after two passes over all the sepsets (one in both directions over each sepset). Message passing proceeds iteratively until the syndrome check is passed or a maximum number of iterations where completed.

A factor graph is limited to only single variable sepsets. An alternative cluster graph representation is one that allows for larger sepsets but retains the original factors as they are (i.e., not increasing the size of the factors). This type of cluster graph structure is achievable with a general-purpose cluster graph construction algorithm termed the layered trees running intersection property (LTRIP) algorithm developed by Streicher and Du Preez (S. Streicher and J. A. du Preez, "Graph coloring: comparing cluster graphs to factor graphs," Proceedings of the ACM Multimedia 2017 Workshop on South African Academic Participation, pp. 35-42, 2017). The objective of this algorithm is not to create fully tree structured graphs but rather to create graphs that satisfy the so-called running intersection property (RIP). The LTRIP algorithm proceeds in layers by considering each variable in a separate layer. For each variable, a complete tree is constructed so that all possible edge connections can be evaluated using some similarity measure to determine edge weights. The cluster graphs as described herein may be formed or generated using the intersection size (i.e., the number of variables shared between clusters) to determine the edge weights. A minimum spanning tree may be formed by using the Prim-Jarník algorithm (R. C. Prim, "Shortest connection networks and some generalizations," The Bell System Technical Journal, vol. 36, no. 6, pp. 1389-1401, 1957). The result is a tree structure where edges contain the variable as its sepset. In the final cluster graph, the sepsets between pairs of clusters are merged across all layers to form the final sepsets. It is important to note that the similarity measure used to determine edge connections between clusters can be changed in the LTRIP algorithm. Clusters can be linked based on the degree of mutual information (MI) shared between them, which maximises the size of the sepsets between clusters. The resulting cluster graph satisfies the RIP and may have multiple variables present in the sepsets. This allows richer information content to be shared between clusters when message passing is performed. The resultant LTRIP graph structure in general will contain loops, i.e. it is not necessarily a tree structure.

FIG. 3 provides an example cluster graph representation (304) of the (10, 5, 4) LDPC code using the LTRIP algorithm. There are two notable differences between the factor graph LDPC code in FIG. 2 and the cluster graph LDPC code in FIG. 3. Firstly, the factor graph LDPC code has more nodes and edges than the cluster graph LDPC code, which will require more computation per message passing iteration. Secondly, all sepsets in the factor graph LDPC code are univariate while some sepsets (306) in the cluster graph LDPC code contain multiple variables. Useful correlations between bits are lost in the factor graph LDPC code while a cluster graph LDPC code can preserve them, making messages between clusters more informative. Inference on this graphical structure typically proceeds by using LBU in which the clusters are initialised using the bit probabilities obtained from the transmission channel. Each bit probability from the channel is multiplied into only one of the clusters that contain that bit, only once. A message passing schedule, such as that described above with reference to FIG. 1B, which orchestrates the sequence in which clusters are updated based on computational considerations may be used. One iteration of message passing may be achieved after two passes over all the sepsets in the graph (one in both directions over each sepset). Message passing iterates until a consensus is reached among all the parity check clusters regarding their shared bit values, and the syndrome check is successfully completed, or a maximum number of iterations is reached. The resulting factors in the cluster graph representation of the (10,5,4) LDPC code of FIG. 3 are the same as the original parity check constraints, but the sepsets can contain multiple random variables.

Experimentation: Influence of Factor Overlap on BER Performance

The purpose of the following experiment is to investigate the influence of factor overlap on the bit error rate (BER) performance of LDPC codes. Factor overlap is defined as the number of variables (or bits) common to two parity check factors. The motivation for this investigation stems from the prevailing design practice of LDPC codes, which uses parity check matrices with little (in most cases one) variable overlap between parity check factors. LDPC codes with a small factor overlap result in cluster graphs with small sepset sizes. The small factor overlap in the prevalent design of LDPC codes may stem from the notion that a substantial overlap in variables between parity factors leads to increased cycles in the factor graph, consequently impacting the LDPC code performance negatively. The advantages of larger sepsets, attainable with cluster graphs, may be negated in such cases. Intuitively, larger factor overlap increases dependencies among bits in the LDPC code that should provide additional information to help correct bit errors. It is important to understand the impact of the cluster graph sepset size on LDPC codes for the following reasons:

1. smaller sepsets in prevailing LDPC codes can potentially obscure the benefits of cluster graphs,
2. in contrast to factor graphs, cluster graphs have fewer loops when they have large sepsets,
3. cluster graphs may be capable of more accurate inference with larger sepsets, and
4. cluster graphs are also more cost-effective with larger sepsets.

To carry out the inquiry, the following experimental approach will be undertaken:
1. Random H-matrices characterised by a specified variable overlap between parity factors are created, which allows for a variety of sepset sizes to be evaluated.
2. It is ensured that all H-matrices have the same error correction capability by selecting them based on their minimum Hamming distance properties. The minimum, median, and maximum statistics of all the minimum Hamming distances for each codeword are the same for each H-matrix selected.
3. The average factor overlap of an H-matrix is measured by taking the average of the largest overlap of each parity factor with all the other parity factors.
4. The average sepset size of the cluster graph representation of an H-matrix is measured by adding all the sepset sizes and dividing it by the number of sepsets in the graph.
5. Three different SNR values are selected for the evaluation (1.11 dB, 3.32 dB, and 5.55 dB) in order to measure consistency.
6. The same transmission channel model is used in all cases. The same noisy received bit values are presented to the factor graph, cluster graph, and junction tree to ensure a like-for-like comparison.
7. The maximum number of iterations for the factor graph and cluster graph is set to 10.
8. The BER of the factor graph and cluster graph is normalised against the BER of the junction tree since the junction tree produces exact bit marginals and hence optimal decoding.

Figure 4A:
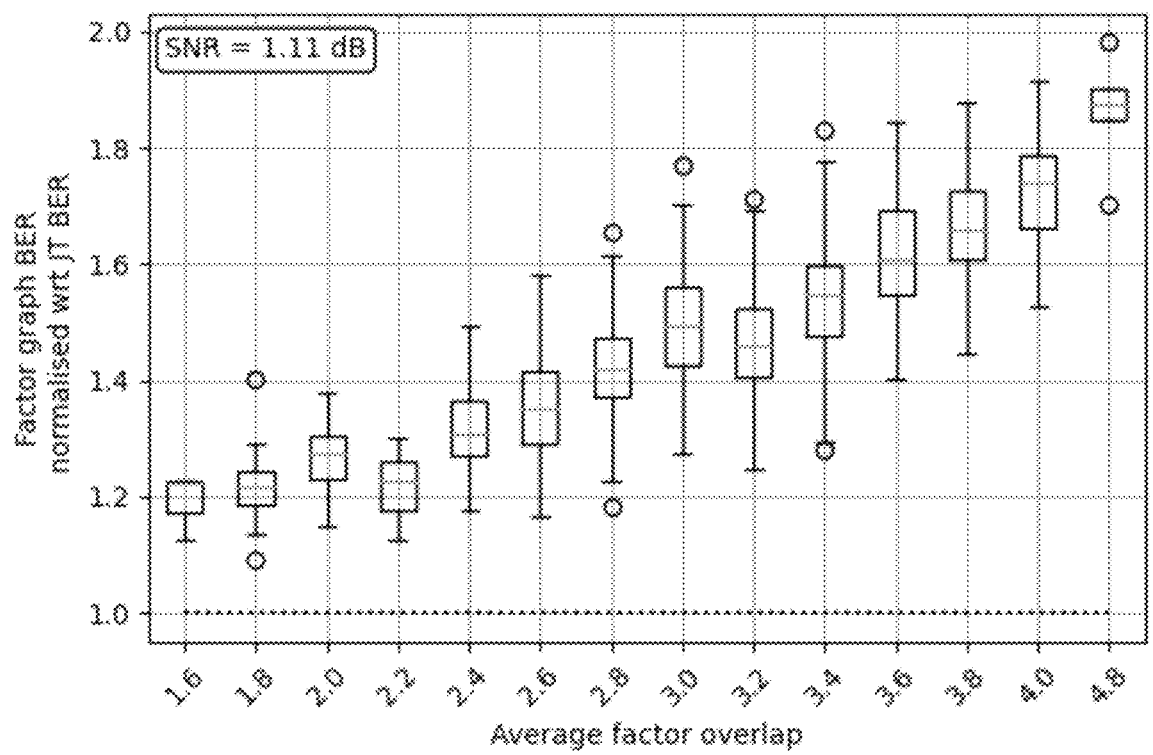
FIG. 4A is a plot of the average factor overlap for a first signal-to-noise ratio (SNR) value which shows that an increase in factor overlap decreases the performance of the factor graph.
Figure 4B:
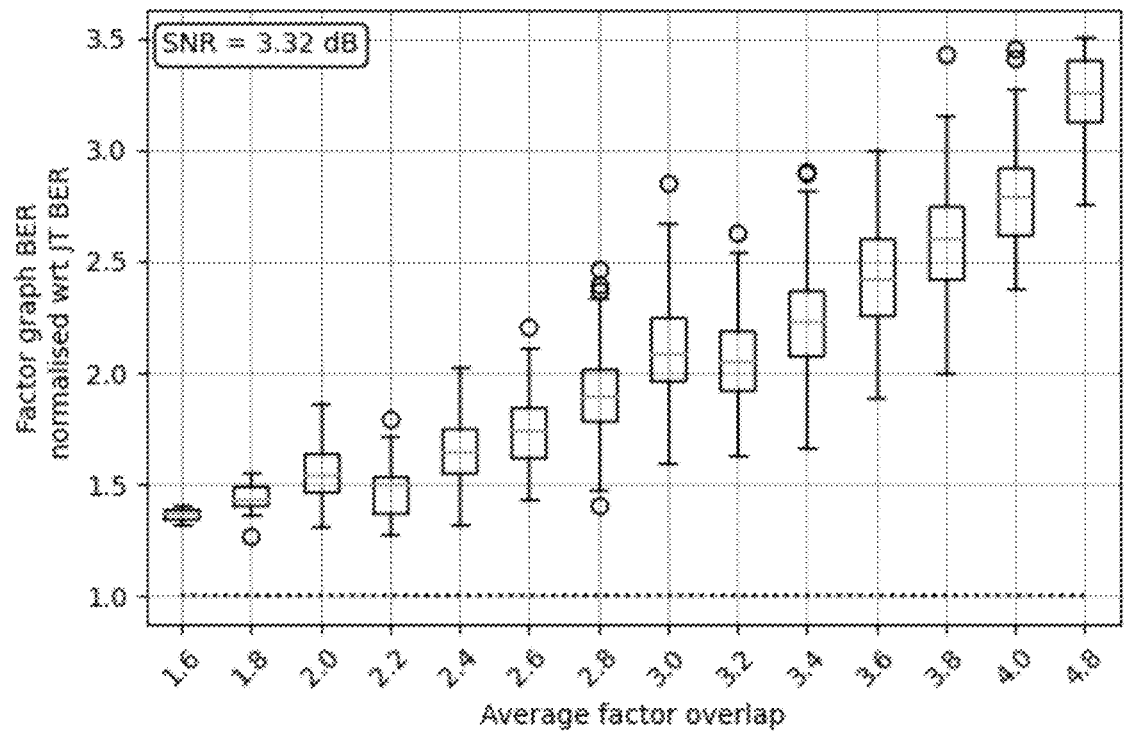
FIG. 4B is a plot of the average factor overlap for a second SNR value.
Figure 4C:
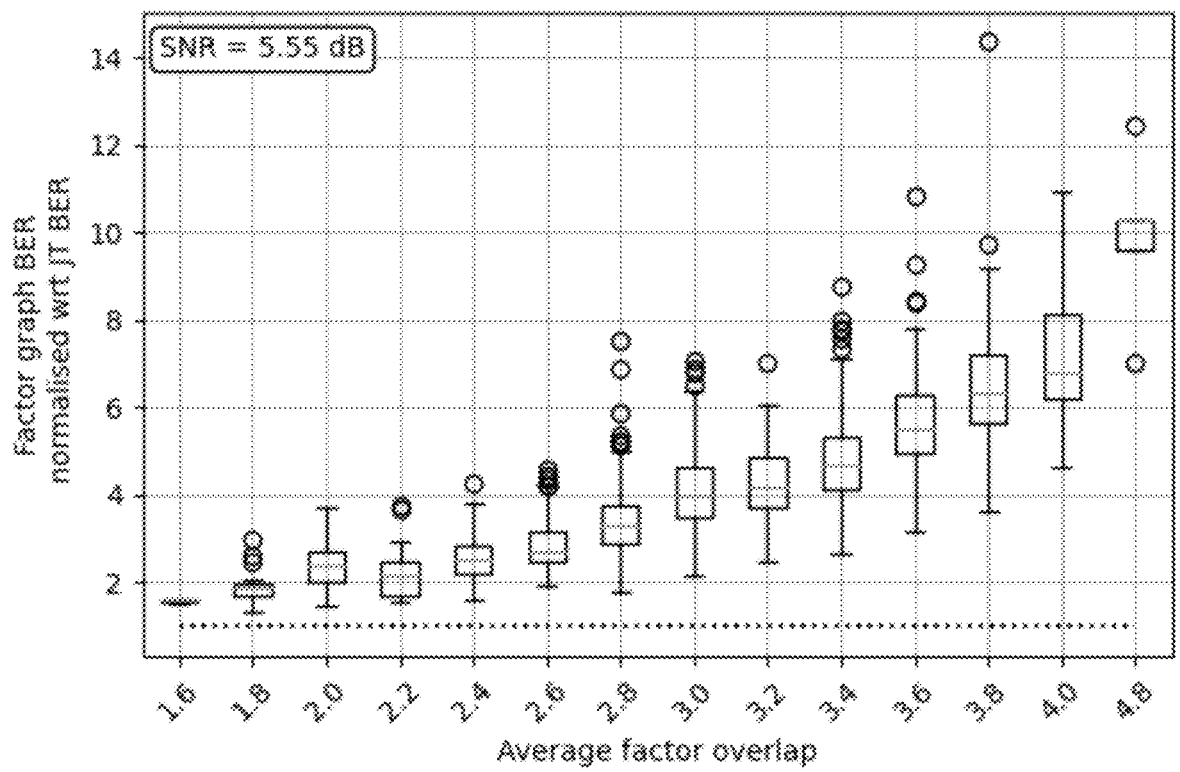
FIG. 4C is a plot of the average factor overlap for a third SNR value.
Figure 4D:
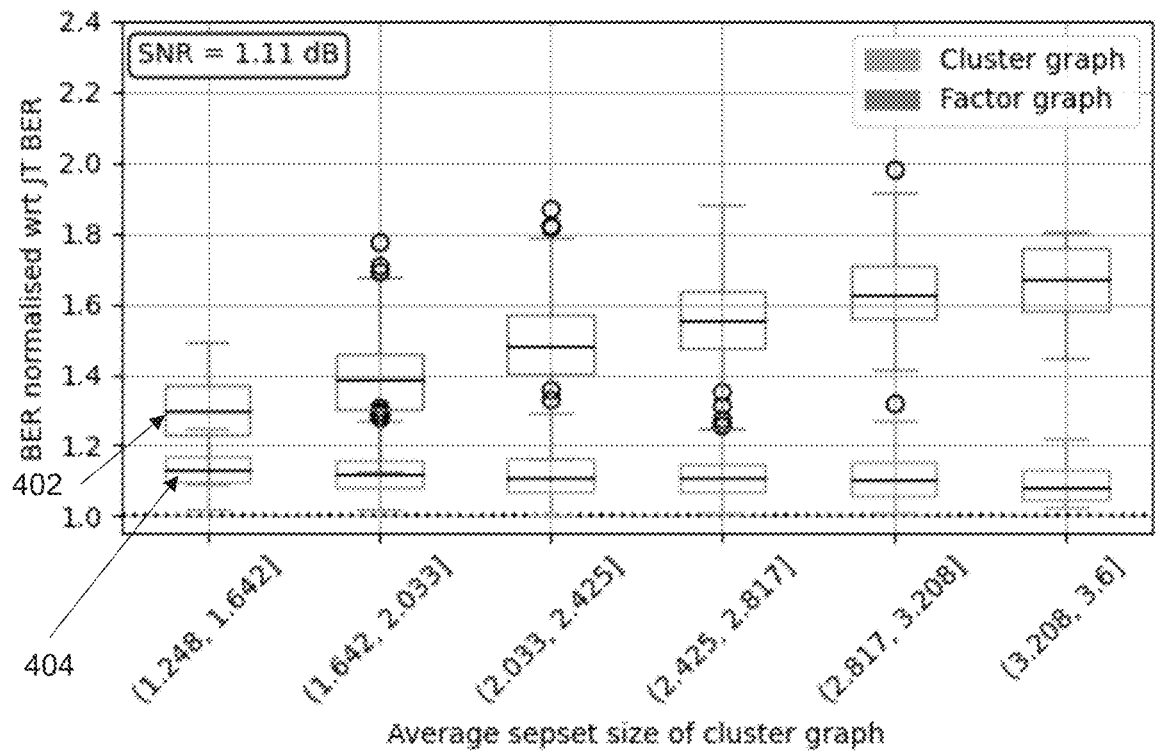
FIG. 4D is a plot of the normalized BER versus average sepset size for a first SNR value which shows that as the sepset size increases, a factor graph's performance worsens while a cluster graph's performance gets better.
Figure 4E:
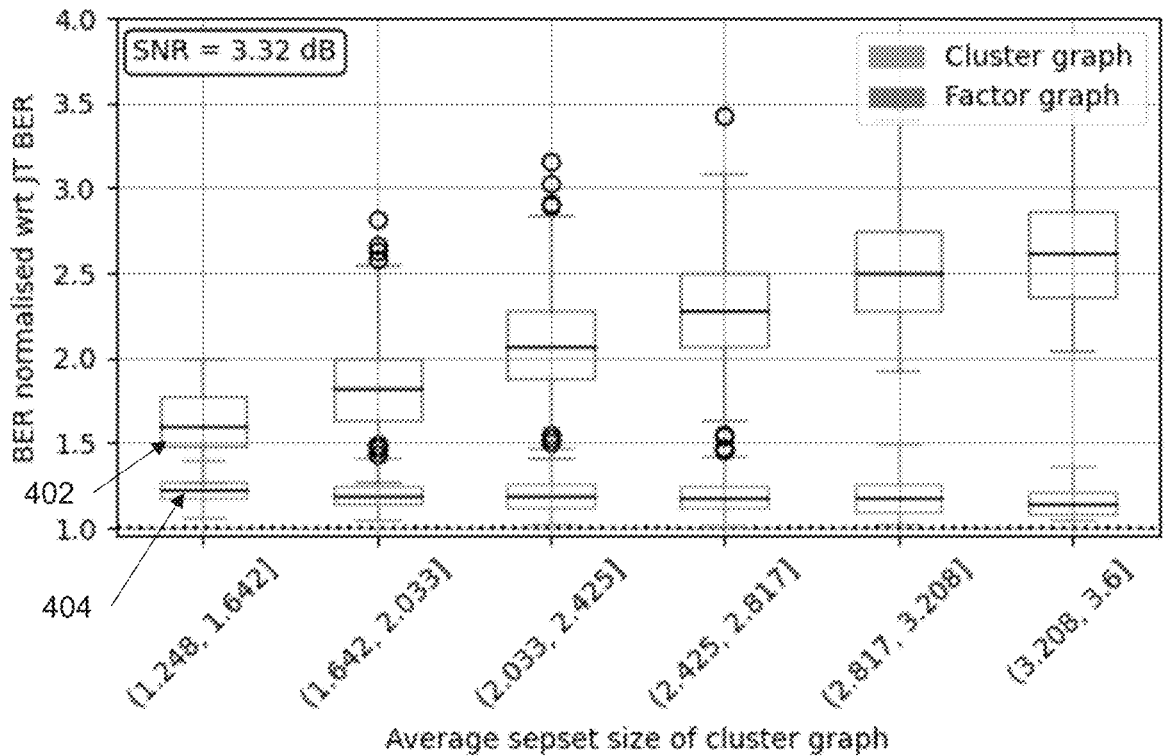
FIG. 4E is a plot of the normalized BER versus average sepset size for a second SNR value.
Figure 4F:
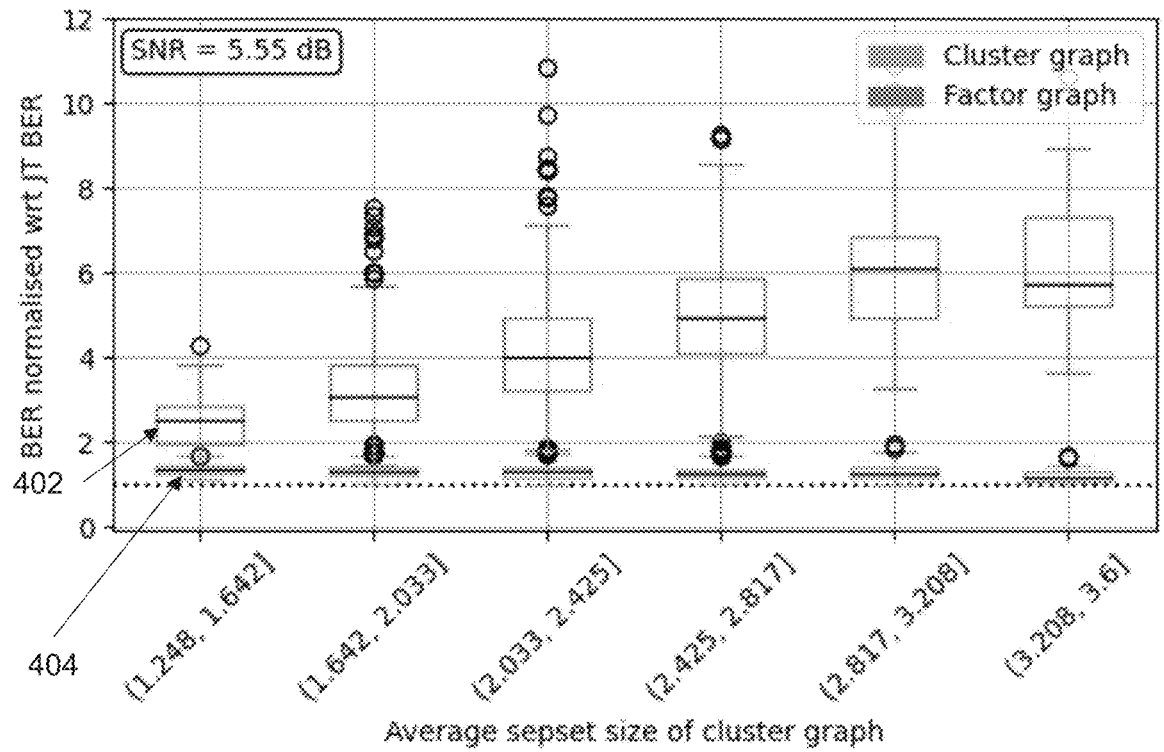
FIG. 4F is a plot of the normalized BER versus average sepset size for a third SNR value.

For the results presented in FIGS. 4A-4F, the normalised BER of the factor graph and cluster graph are reported relative to the corresponding BER obtained from the junction tree (the junction tree provides the exact inference and best possible BER of a code). This gives a plot with a relative BER of one at the bottom (i.e., the optimal junction tree value is shown with a black dotted line) and higher normalised BER values for the factor graph and cluster graph. It also provides an implicit normalisation that compensates for the error correcting capability of the codes if small differences across the spectrum of Hamming distances within those randomly created H-matrices are present. In FIGS. 4A-4C, at the different SNRs tested, the factor graph performs closer to the junction tree at a low average factor overlap than at a high average factor overlap. The good performance of the factor graphs at low average factor overlap is not because a small overlap is a better code (the junction tree makes this very clear), but because the decoding algorithm has an inherent weakness that degrades with larger overlaps. This may explain why LDPC codes are designed to have minimal factor overlap. For the results presented in FIGS. 4D-4F, the comparison between the factor graphs (402) and cluster graphs (404) is by considering sepset sizes, as this is directly associated with how communication takes place within a cluster graph. For the results in FIG. 4D-4F, at the different SNRs tested, the range of average sepset size of the cluster graph is plotted on the horizontal axis and the normalised BER of the factor graph and cluster graph is plotted on the vertical axis. This is a direct comparison of a cluster graph's performance with its corresponding factor graph's performance. It should be noted that, as the average sepset size increases, the cluster graph converges toward optimal junction tree performance. Conversely, the factor graph does the opposite. The cluster graphs also clearly outperform the factor graphs and the cluster graphs show much less variation, making them much more consistent. These results established that cluster graphs are capable of more accurate inference with larger sepsets, in stark contrast to factor graphs.

Experimentation: Accuracy of Bit Marginals

The purpose of the following experiment is to investigate the influence of factor overlap on the accuracy of the bit marginals obtained after the LDPC code converged. This is important to understand for the following reasons: cluster graphs may offer more accurate inference with larger sepsets; and, more accurate inference leads to a better approximation of the true error correcting capability of an LDPC code. To achieve this objective, the same experimental setup as discussed above is used. To illustrate that cluster graphs are capable of producing more exact bit marginals than factor graphs, the Kullback-Leibler (KL) divergence measure is used:

$$D_{KL}(P\|Q) = \sum_x P(x) \cdot \log_2\left(\frac{P(x)}{Q(x)}\right).$$

The KL divergence measures the average number of extra bits required if x is coded with a different distribution $Q(x)$ instead of its true distribution $P(x)$. The similarity between the bit marginal distributions $P(x)$ obtained from the junction tree (the true distribution that produces exact inference) and the bit marginal distributions $Q(x)$ obtained from the factor and cluster graph respectively (the approximation distributions) are evaluated. The average KL divergence of all bits in a codeword is captured for each of the randomly created H-matrices per SNR tested.

Figure 5A:
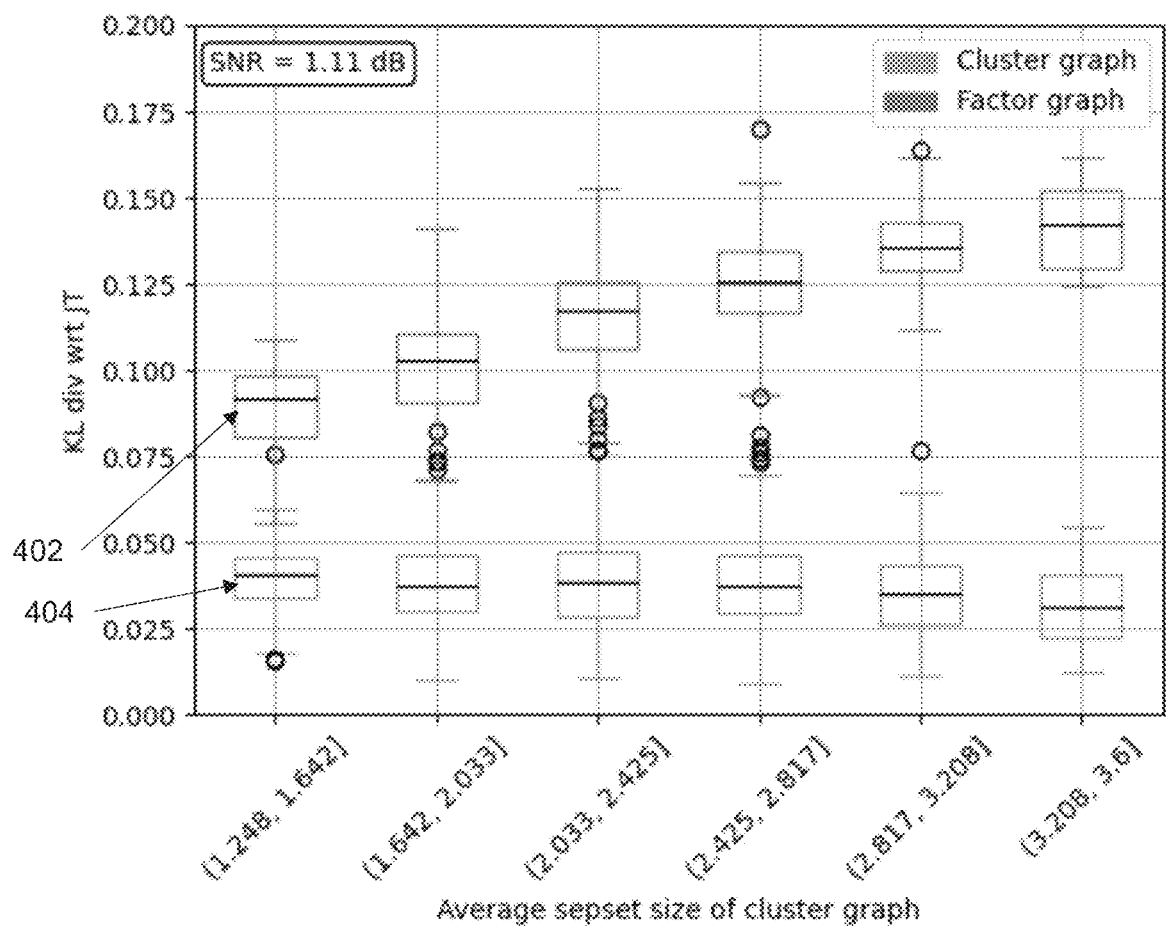
FIG. 5A is a plot of the Kullback-Leibler (KL) divergence between a factor graph and junction tree, and the KL divergence between a cluster graph and junction tree for a first SNR value.
Figure 5B:
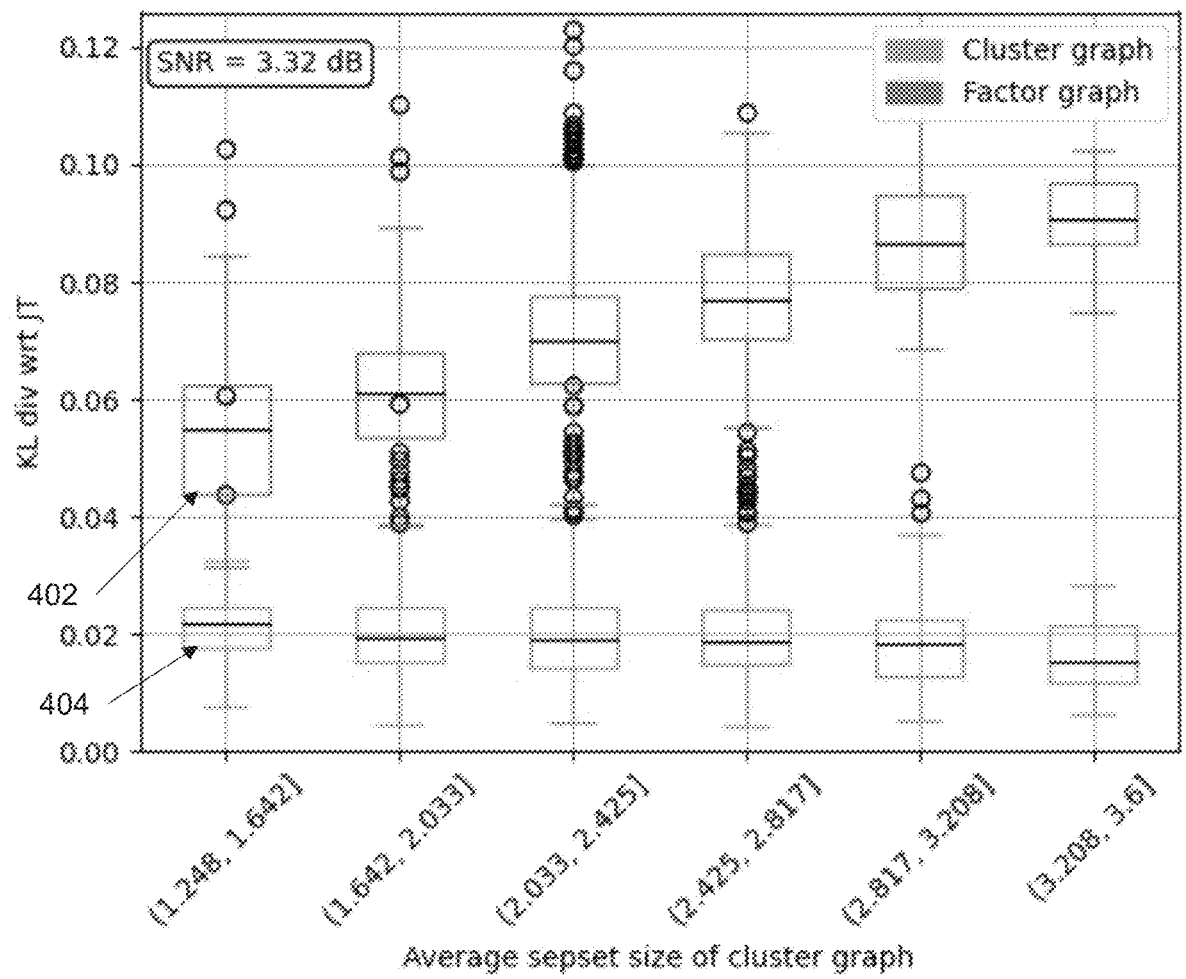
FIG. 5B is a plot of the KL divergence between a factor graph and junction tree, and the KL divergence between a cluster graph and junction tree for a second SNR value.
Figure 5C:
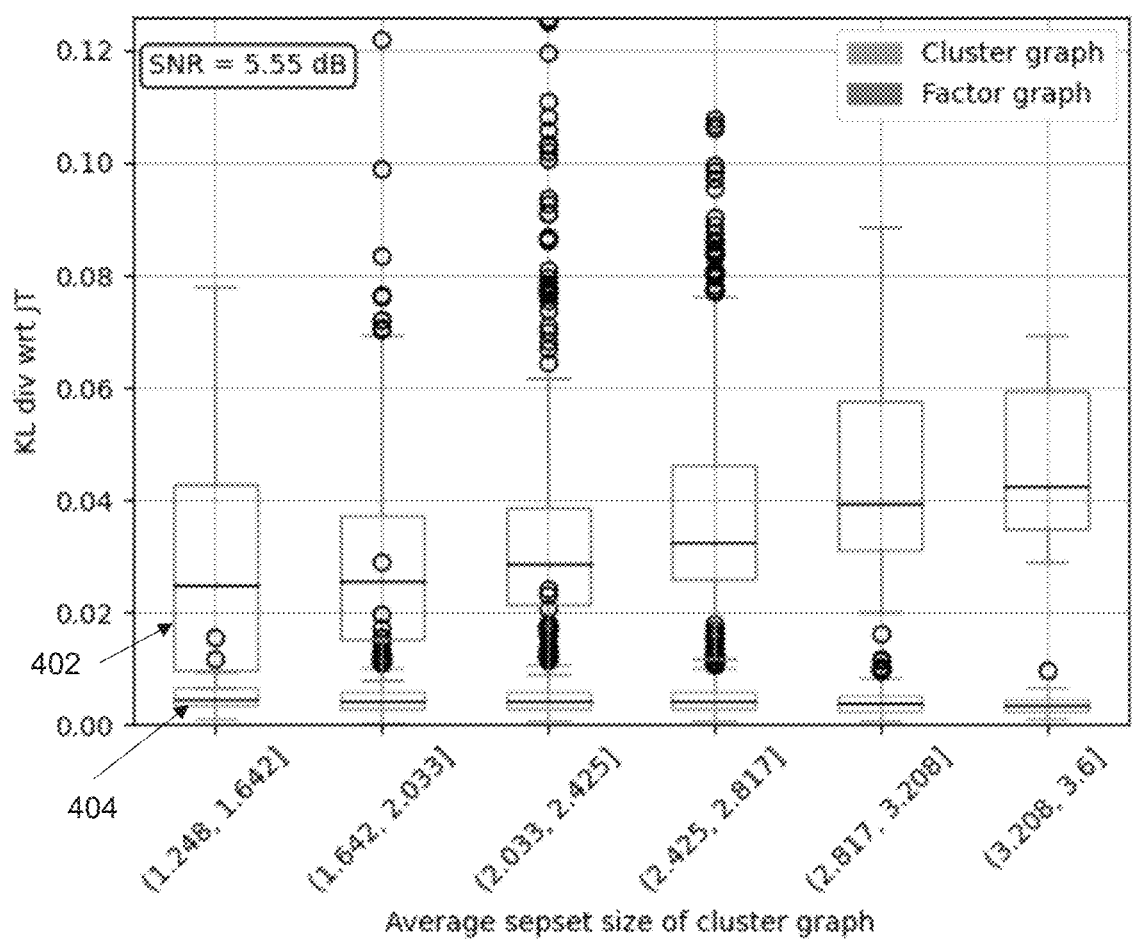
FIG. 5C is a plot of the KL divergence between a factor graph and junction tree, and the KL divergence between a cluster graph and junction tree for a third SNR value.

The result of the experiment is presented in FIGS. 5A-5C and shows a similar trend as the results presented above. As the sepset size increases, a cluster graph's KL divergence converges toward zero, while the factor graph's KL divergence diverges upwards. In other words, larger sepset sizes within a cluster graph imply a more accurate approximation of the true marginal distributions obtained from the junction trees. It can also be observed that as the SNR increases, there are more factor graph outliers towards the upper end of the boxplots. The outliers are not at the very small (left) or very large (right) sepsets sizes, but more in the middle region around an average sepset size of two. This is perhaps an artefact because there are many more H-matrices in that sepset size range, and outlier behaviour becomes more likely as such. These results show that cluster graphs offer more accurate inference with larger sepsets, as a result, the more accurate inference leads to the ideal BER performance of the junction tree. It can be seen from the results in FIGS. 5A-5C that the cluster graph tends to follow the junction tree as the sepset size increases while the factor graph shows the antithesis. The cluster graph is also closer to the junction tree overall.

Experimentation: BER and Convergence Performance Across SNRs

The purpose of this experiment is to understand: the BER performance behaviour of an LDPC code across a wider spectrum of SNR values; the convergence behaviour of an LDPC code across a wider spectrum of SNR values; and, the accuracy of the bit marginals of an LDPC code across a wider spectrum of SNR values. The same (10,5,4) LDPC code introduced above is used and a factor graph, cluster graph and junction tree are compared over a range of SNR values. Here the BER and convergence performance of the (10,5,4) LDPC code represented as a factor graph (in FIG. 2) and a cluster graph (in FIG. 3) are considered. For the experiment, a transmission channel model is used. It is assumed that a transmitted bit has unit energy with knowledge of the channel noise precision.

Figure 6A:
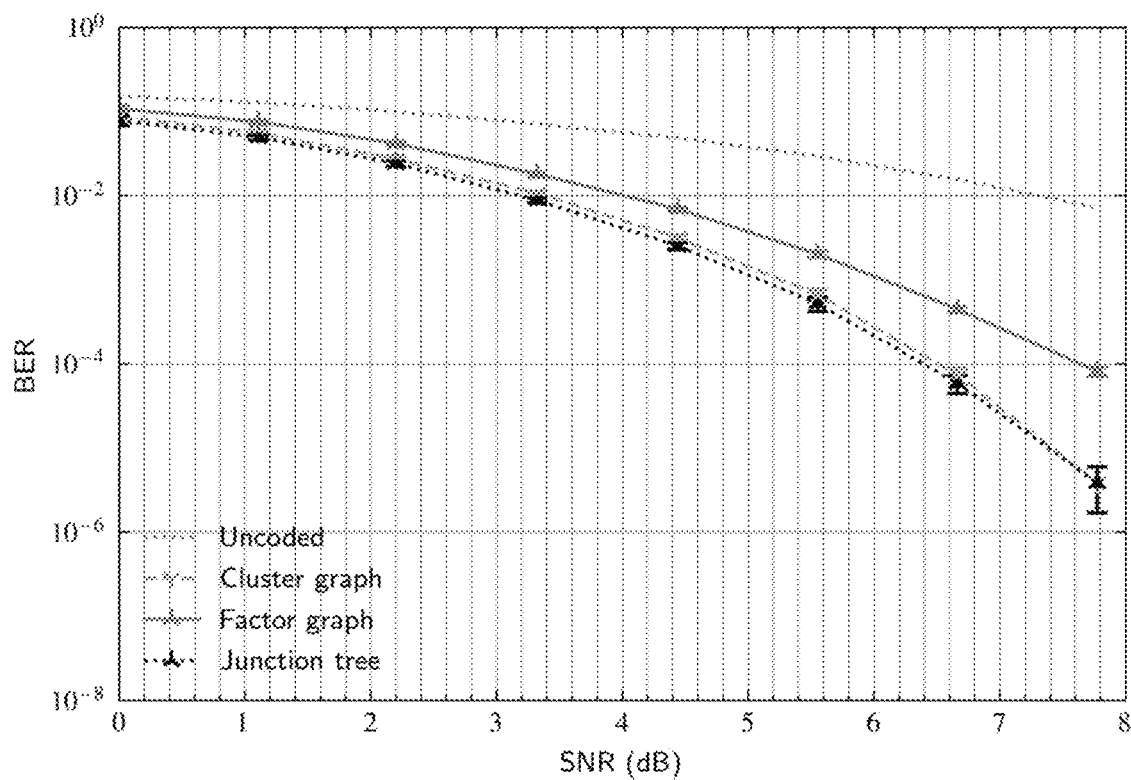
FIG. 6A is a plot of the (10,5,4) LDPC code showing the BER performance between a factor graph, junction tree, and cluster graph.

The BER results are shown in FIG. 6A. The junction tree produces exact bit marginals and therefore an optimal BER (dotted line). The cluster graph (dashed line) performs closer to the optimal BER curve compared to the factor graph (solid line). The difference between the factor graph and cluster graph becomes more pronounced as the SNR increases. Also, the factor graph requires more iterations than the cluster graph, and the difference is more pronounced at lower SNRs. When comparing the median statistics, the marginal distributions obtained from the cluster graph are more similar to the marginal distributions obtained from exact inference as compared to the factor graph over all SNR categories. The KL divergence between the cluster graph marginals and exact inference marginals is also less varied compared to the factor graph. The investigation done in this experiment shows that a cluster graph representation of an LDPC code is computationally more efficient and converges faster than a factor graph representation. Furthermore, the cluster graph produces bit marginals closer to the exact bit marginals than the factor graph. The more exact bit marginals deliver better BER performance and are obtainable with cycles still present in the cluster graph. The multivariate sepsets preserve correlations between bits, which speeds up the convergence rate also contributing to computational savings.

Computational Efficiency

Figure 7A:
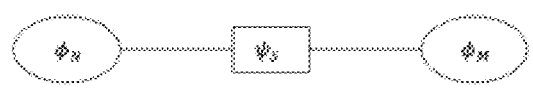
FIG. 7A is a schematic diagram which illustrates between-cluster messages.

Here the computational complexity involved during message passing between two adjacent clusters in a factor graph and in a cluster graph respectively is considered. For the factor graph, the variable nodes are considered as single variable clusters. The two primary factor operations performed during message passing are factor multiplication and factor marginalisation. For each, the number of operations required in one forward and one backward sweep of message passing over the sepset is determined. Using FIG. 7A, messages between cluster $\phi N$ and cluster $\phi M$ are considered. The subscripts (N, S, and M) denote the cluster size and the case where N=4, S=2, and M=3 is considered as an example. The general expressions for each of the operations are provided after illustrating how they apply to this example.

Figure 7B:
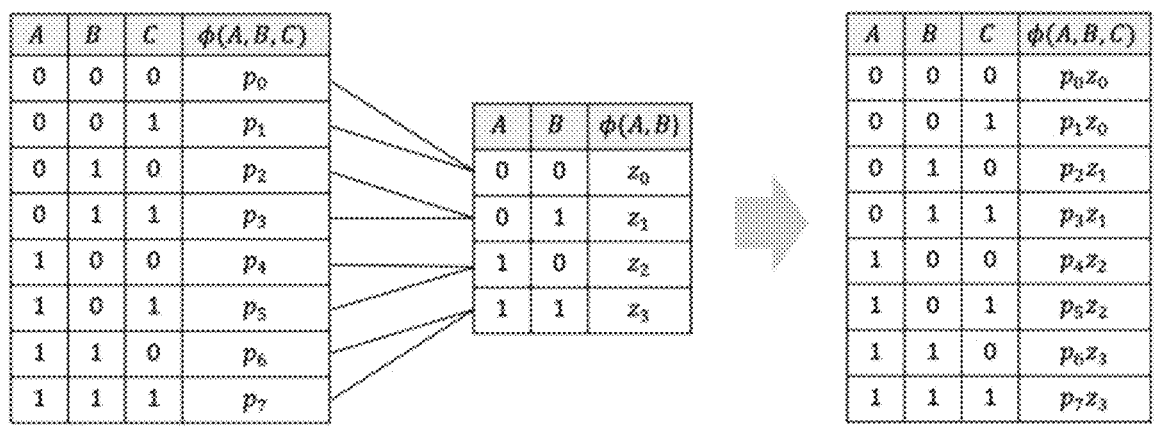
FIG. 7B is a schematic diagram which illustrates factor multiplication between a sepset of size S=2 and a cluster of size M=3 for which 8 multiplications are required; and, FIG. 7C is a schematic diagram which illustrates factor marginalisation between a cluster of size N=4 and sepset of size S=2 for which 12 additions are required.

Multiplication For a message passed from cluster $\phi N$ to cluster $\phi M$, a factor division is required before a sepset $\psi S$ is multiplied into a cluster so that the previous sepset belief can be removed. For this example, this requires $2^2=4$ multiplications, but more generally it requires $2^S$ multiplications. This step is not depicted graphically as it closely resembles a factor multiplication operation. Nonetheless, the factor divisions in the final formulation are considered. After the factor division step, the sepset belief of size S=2 is multiplied into cluster $\phi M$ using factor multiplication shown in FIG. 7B. For this example, this operation requires 8 multiplications. The general expression for the number of multiplications required for multiplying a sepset into a cluster of size M is 2. For a message passed from cluster $\phi M$ to cluster $\phi N$, a factor division is required first which requires $2^S$ multiplications as stated previously. The sepset belief is then multiplied into cluster $\phi N$ which has N number of variables. This requires a $2^N$ number of multiplications. The total number of multiplications required for the between cluster multiplication is therefore $2^S+2^M+2^S+2^N$.

Figure 7C:
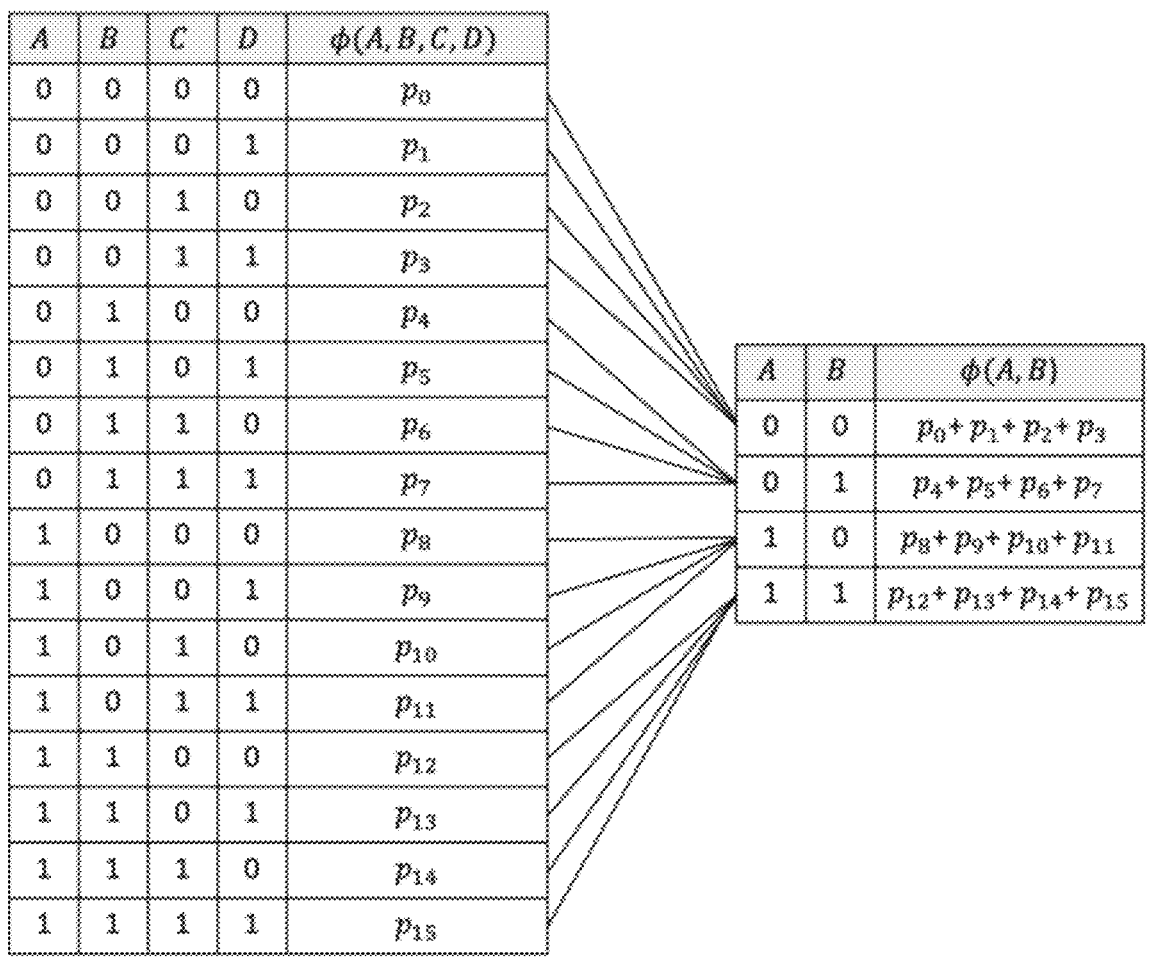

Marginalisation Starting with a message passed from cluster $\phi N$ to cluster $\phi M$, a cluster with N number of variables is marginalised to obtain a sepset with S number of variables. FIG. 7C illustrates how marginalisation is performed on a factor of size 4 in order to obtain a sepset of size 2. For this example, this marginalisation operation requires 12 additions. The general expression for the number of additions required when marginalising a cluster of size N to obtain a sepset of size S is $$2^S\left(\frac{2^N}{2^S}-1\right)=2^N-2^S.$$

For the message in the opposite direction, marginalisation is performed on a cluster of size M in order to obtain a sepset of size S. The same general expression obtained as before is used, since the only difference is the message direction. The number of additions required is expressed as $$2^S\left(\frac{2^M}{2^S}-1\right)=2^M-2^S.$$

The total number of additions required for the between cluster marginalisation is therefore $2^N-2^S+2^M-2^S$. Consider now how the expressions for the marginalisation and multiplication required between cluster messages apply to a factor graph and a cluster graph respectively. For a factor graph, N=S=1 (since the variable nodes and sepsets always contain only one random variable), which gives $2^M-2$ additions, and $2^M+6$ multiplications. The between cluster-computation for both graphs is summarised in the following table.

| | Marginalisation (total additions): | Multiplication (total multiplications): |
|---|---|---|
| Factor graph | $2^M - 2$ | $2^M + 6$ |
| Cluster graph | $2^N + 2^M - 2^{S+1}$ | $2^N + 2^M + 2^{S+1}$ |

Figure 6B:
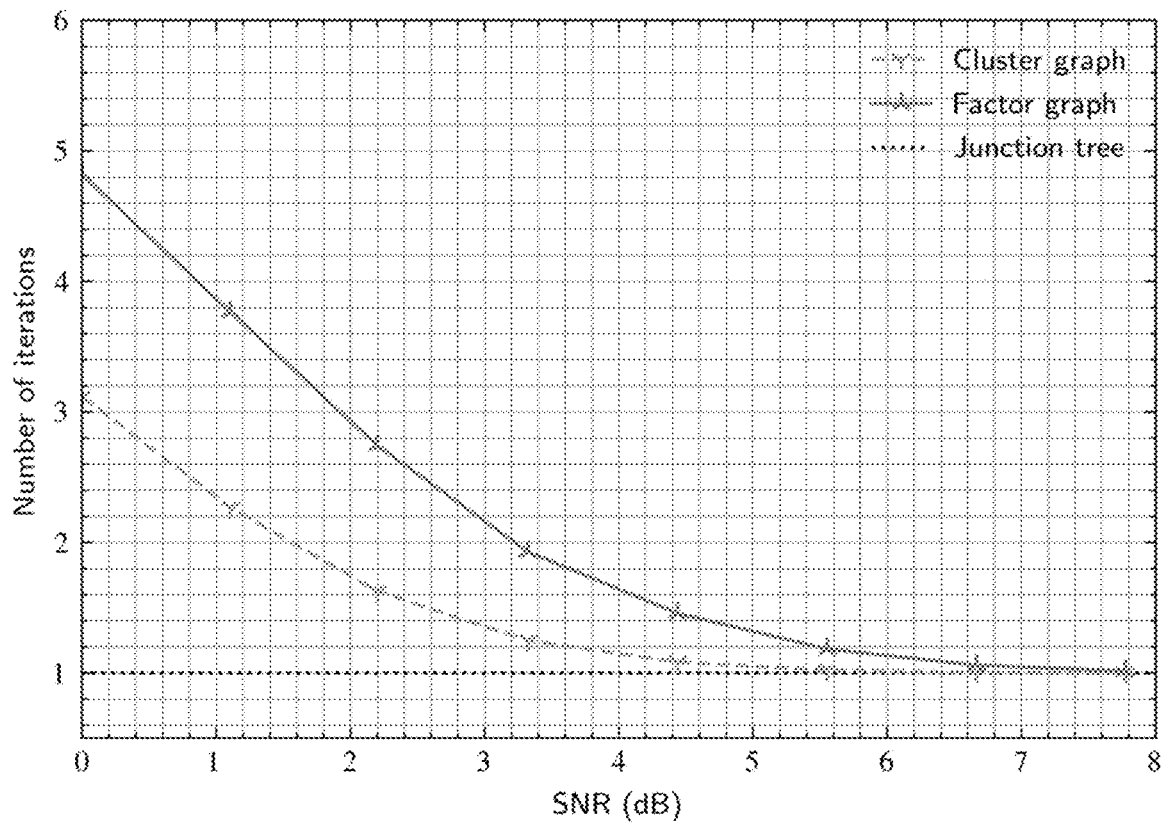
FIG. 6B is a plot of the (10,5,4) LDPC code showing the number of message passing iterations required for a factor graph, junction tree, and cluster graph.
Figure 6C:
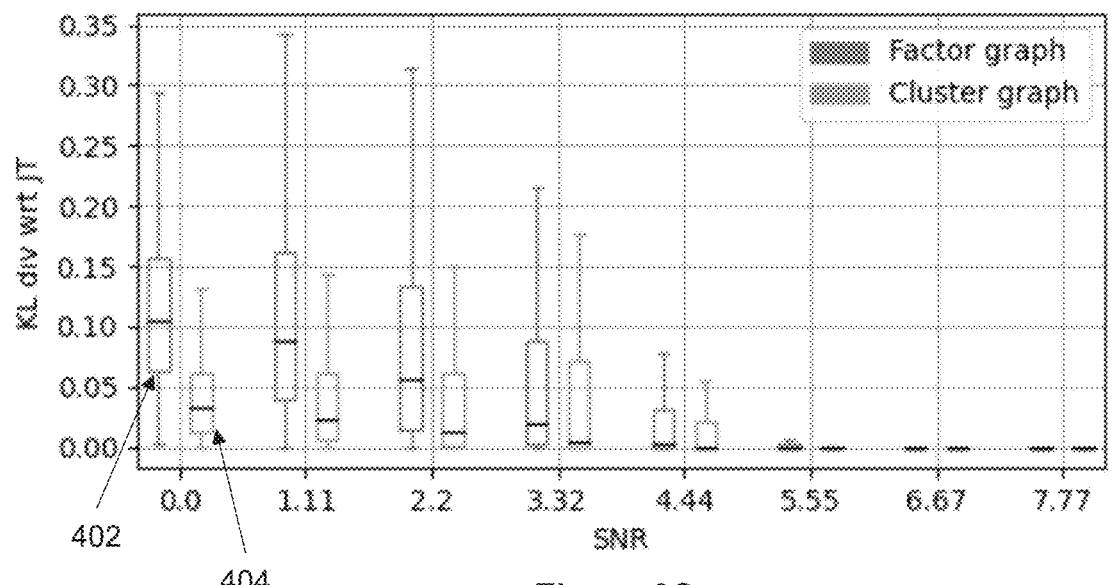
FIG. 6C is a plot showing the KL measure between the exact bit marginals from the junction tree compared to the factor graph bit marginals and the cluster graph bit marginals and in which the cluster graph produces bit marginals closer to exact bit marginals than the factor graph.

These formulae can be applied to an example factor graph, junction tree, and cluster graph to understand the required computation within a more comprehensive graph. The number of message passing iterations required at low SNR by the (10,5,4) LDPC code performance shown in FIG. 6B can be used to obtain an estimate of the total number of operations for each graph. The summarised results are presented in the table below. From these results, the junction tree looks promising, especially when considering it only requires 1 iteration of message passing. However, the junction tree becomes significantly more expensive when implemented on larger graphs. The cluster graph uses less computation and fewer iterations to converge than the factor graph.

| | Number of edges: | Additions per iteration: | Multiplications per iteration: | Total number of operations: |
|---|---|---|---|---|
| Factor graph | 10 | 92 | 172 | 10 (92 + 172) = 2640 |
| Junction tree | 2 | 32 | 80 | 1 (32 + 80) = 112 |
| Cluster graph | 3 | 48 | 80 | 6.5 (48 + 80) = 832 |

A system implementing linear error correction using linear error correcting codes is described herein. The system may include a decoder which is configured to implement a cluster graph representation of a linear error correcting code (such as an LDPC code). In some examples described herein, configuration of a cluster graph-based code is provided, which: uses clusters in the cluster graph that have the same parity-check factors as the original factors in the parity-check matrix; uses the running intersection property (RIP) to connect parity-check clusters together in the graph; uses messages passed between clusters capable of being multivariate messages (i.e., the messages are not limited to single variable messages such as those used in standard factor graph codes); and, relies on the average factor overlap or sepset size as a design parameter in the design of the parity-check matrices for the cluster graph-based codes.

Aspects of the present disclosure provide that, by using cluster graphs instead of the customary factor/Tanner graphs, larger overlaps can be sought, leading to better accuracy and convergence. In accordance with aspects of the present disclosure, it is understood that that larger sepsets do not necessarily cause cycles in a cluster graph, but instead rather removes loops in the cluster graph. In fact, the loops in a factor graph are not relevant for the performance of the code. In accordance with aspects of the present disclosure, it is understood that large sepsets can help approximate the ideal accuracy of the junction tree. In accordance with aspects of the present disclosure, it is understood that more powerful linear error correcting codes can be obtained by simultaneously maximising the somewhat opposing requirements of large sepsets and large Hamming distances. In accordance with aspects of the present disclosure, it is demonstrated that, using the same code, cluster graphs outperform factor graphs; new codes can be built which ignore the overlap of 1 restriction and which can maximise the overlap.

A system and apparatus are thus provided which implement cluster graph inference at lower computational cost; attain more accurate inference and therefore better BER performance compared to factor graph LDPC codes; offer faster convergence compared to factor graph LDPC codes; and leverage a design parameter for the development of cluster graph LDPC codes in the form of factor overlap or sepset size. The true error correcting capability of an LDPC code is better achieved when approximate inference via cluster graphs is applied to LDPC codes with large overlap between factors. LDPC codes with large factor overlap have cluster graph representations with large sepsets which reduces loops in the graph, and messages passed between clusters are more informed, resulting in more accurate and faster inference. The graphical structure of a factor graph, on the other hand, exhibits the complete opposite behaviour; performance diminishes with extensive factor overlap, as it leads to an increase in loops within the graph, resulting in less accurate inference. Even when factor graph LDPC codes exhibit optimal performance, which is at the minimal factor overlap region, the superiority of cluster graphs persists.

Although the foregoing description with reference to the drawings has been primarily directed towards embodiments employing cluster graph representations of linear error correcting codes, it should be appreciated that the embodiments described herein can be extended, mutatis mutandis, to region graph representations of linear error correcting codes.

The foregoing description has been presented for the purpose of illustration; it is not intended to be exhaustive or to limit the invention to the precise forms disclosed. Persons skilled in the relevant art can appreciate that many modifications and variations are possible in light of the above disclosure. The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention set forth in any accompanying claims. Finally, throughout the specification and any accompanying claims, unless the context requires otherwise, the word 'comprise' or variations such as 'comprises' or 'comprising' will be understood to imply the inclusion of a stated integer or group of integers but not the exclusion of any other integer or group of integers.

The invention claimed is:

1. An apparatus comprising:
   a receiver for receiving a sequence of bits via a channel, the sequence of bits having been encoded at a source using a linear error correcting code; and
   a decoder for decoding the received sequence of bits and outputting a decoded sequence of bits, wherein the decoder implements a message passing schedule determined using a cluster graph representation of the linear error correcting code for passing of joint distribution-based messages between parity check clusters of the cluster graph representation of the linear error correcting code, including iterating message passing until consensus between all the parity check clusters regarding shared bit values is reached, and outputting the decoded sequence of bits when consensus is reached.

2. The apparatus as claimed in claim 1, wherein the linear error correcting code is configured such that a metric based on an overlap of one or more parity check factors with one or more other parity check factors is greater than 1.

3. The apparatus as claimed in claim 2, wherein the metric is an average factor overlap.

4. The apparatus as claimed in claim 3, wherein the average factor overlap is determined by taking an average of a largest factor overlap of each parity check factor with one or more other parity check factors.

5. The apparatus as claimed in claim 1, wherein the linear error correcting code is configured such that an average factor overlap determined by taking an average of a largest factor overlap of each parity check factor with all of other parity check factors is greater than 1.

6. The apparatus as claimed in claim 1, wherein the linear error correcting code is configured such that the cluster graph representation thereof has at least a predetermined number of sepsets with size greater than 1.

7. The apparatus as claimed in claim 1, wherein the linear error correcting code is configured such that the cluster graph representation thereof has an average sepset size which is maximised for a predetermined minimum Hamming distance.

8. The apparatus as claimed in claim 1, wherein the linear error correcting code is configured such that the cluster graph representation thereof has an average sepset size which is greater than 1.

9. The apparatus as claimed in claim 6, wherein a sepset size is a number of variables about which two adjacent factors of the cluster graph representation of the linear error correcting code exchange information.

10. The apparatus as claimed in claim 1, wherein the linear error correcting code is configured by increasing a factor overlap of the linear error correcting code.

11. The apparatus as claimed in claim 1, wherein the linear error correcting code is a linear block code, wherein the linear error correcting code is a low-density parity check (LDPC) code or a polar code.

12. The apparatus as claimed in claim 1, wherein the cluster graph representation of the linear error correcting code is determined using a layered trees running intersection property (LTRIP) algorithm.

13. The apparatus as claimed in claim 1, wherein the decoder is configured to implement sum-product message passing.

14. The apparatus as claimed in claim 1, wherein the decoder is configured to implement a loopy belief update-(LBU-) based message passing.

15. A method comprising:

receiving a sequence of bits via a channel, the sequence of bits having been encoded at a source using a linear error correcting code;

decoding the received sequence of bits by implementing a message passing schedule determined using a cluster graph representation of the linear error correcting code for passing of joint distribution-based messages between parity check clusters of the cluster graph representation of the linear error correcting code, including iterating message passing until consensus between all the parity check clusters regarding shared bit values is reached, and outputting the decoded sequence of bits when consensus is reached.

16. The method as claimed in claim 15, wherein message passing is based on a message passing schedule determined for the cluster graph representation of the linear error correcting code.

17. The method as claimed in claim 15, wherein outputting the decoded sequence of bits is performed further when: a syndrome check is successfully completed; or, a maximum number of iterations is reached.

18. The method as claimed in claim 15, wherein message passing is implemented using a loopy belief update-(LBU-) algorithm.

* * * * *

UNITED STATES PATENT AND TRADEMARK OFFICE
CERTIFICATE OF CORRECTION

PATENT NO. : 12,418,362 B1  
APPLICATION NO. : 19/040282  
DATED : September 16, 2025  
INVENTOR(S) : Du Preez et al.

Page 1 of 1

It is certified that error appears in the above-identified patent and that said Letters Patent is hereby corrected as shown below:

In the Claims

In Column 9, Line 11, delete "as a,b. The" and insert --as $u_{a,b}$. The--.

In Column 9, Line 13, delete "by $u_{\dagger b,a}$. If" and insert --by $u_{\backslash b,a}$. If--.

In Column 9, Line 14, delete "messages $u_{\dagger b,a}$, these" arid insert --messages $u_{\backslash b,a}$, these--.

In Column 9, Line 22, delete "set $S_{a,b}$ removes" and insert --set $\backslash S_{a,b}$ removes--.

In Column 9, Line 46, delete "(Approx.) the $u_{\dagger b,a}$ term" and insert --the $u_{\backslash b,a}$ term--.

In Column 17, Line 57, delete "M is 2. For" and insert --M is $2^M$. For--.

Signed and Sealed this  
Tenth Day of February, 2026

John A. Squires  
*Director of the United States Patent and Trademark Office*